US011935782B2

United States Patent
Sandhu et al.

(10) Patent No.: US 11,935,782 B2
(45) Date of Patent: Mar. 19, 2024

(54) METHODS FOR INHIBITING LINE BENDING DURING CONDUCTIVE MATERIAL DEPOSITION, AND RELATED APPARATUS

(71) Applicant: Micron Technology, Inc., Boise, ID (US)

(72) Inventors: Gurtej S. Sandhu, Boise, ID (US); Marko Milojevic, Boise, ID (US); John A. Smythe, Boise, ID (US); Timothy A. Quick, Boise, ID (US); Sumeet C. Pandey, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 75 days.

(21) Appl. No.: 17/653,790

(22) Filed: Mar. 7, 2022

(65) Prior Publication Data

US 2022/0238340 A1 Jul. 28, 2022

Related U.S. Application Data

(62) Division of application No. 16/773,636, filed on Jan. 27, 2020, now Pat. No. 11,270,909.

(51) Int. Cl.
*H01L 21/768* (2006.01)
*H01L 21/28* (2006.01)
(Continued)

(52) U.S. Cl.
CPC .. *H01L 21/76843* (2013.01); *H01L 21/28247* (2013.01); *H01L 21/67069* (2013.01);
(Continued)

(58) Field of Classification Search
CPC ......... H01L 29/42392; H01L 29/42356; H01L 29/423; H01L 29/42372; H01L 29/42376;
(Continued)

(56) References Cited

U.S. PATENT DOCUMENTS

| 9,570,343 B2 | 2/2017 | Westwood |
| 2011/0054184 A1 | 3/2011 | Yoshida et al. |

(Continued)

FOREIGN PATENT DOCUMENTS

WO 2018/063277 A1 4/2018

OTHER PUBLICATIONS

Via et al., From Thin Film to Bulk 3C—SiC Growth: Understanding the Mechanism of Defects Reductions, Materials Science in Semiconductor Processing, vol. 78, (2018), pp. 57-68.

*Primary Examiner* — Thanhha S Pham
(74) *Attorney, Agent, or Firm* — TraskBritt

(57) ABSTRACT

A method of forming a structure comprises forming a pattern of elongate features extending vertically from a base structure. Conductive material is formed on the elongate features. After completing the forming of the pattern of elongate features, the elongate features, the conductive material, or both is (are) exposed to at least one surface treatment gas. The at least one surface treatment gas comprises at least one species formulated to diminish attractive or cohesive forces at a surface of the conductive material. Apparatus and additional methods are also described.

22 Claims, 12 Drawing Sheets

(51) Int. Cl.
H01L 21/67 (2006.01)
H01L 23/522 (2006.01)
H01L 23/528 (2006.01)
H01L 23/538 (2006.01)
H01L 29/40 (2006.01)
H01L 29/423 (2006.01)
H01L 29/66 (2006.01)

(52) U.S. Cl.
CPC .. *H01L 21/76814* (2013.01); *H01L 21/76853* (2013.01); *H01L 21/76855* (2013.01); *H01L 23/5226* (2013.01); *H01L 23/5228* (2013.01); *H01L 23/528* (2013.01); *H01L 23/5283* (2013.01); *H01L 23/5386* (2013.01); *H01L 29/401* (2013.01); *H01L 29/4232* (2013.01); *H01L 29/66795* (2013.01)

(58) Field of Classification Search
CPC ............... H01L 29/401; H01L 29/432; H01L 29/66795; H01L 21/28531; H01L 21/76843; H01L 21/76877; H01L 21/28247; H01L 21/28506; H01L 21/7685; H01L 21/76852; H01L 21/76853; H01L 21/76855; H01L 21/76856; H01L 21/76859; H01L 21/76858; H01L 21/76868; H01L 21/76883; H10B 12/053; H10B 12/056; H10B 12/395
See application file for complete search history.

(56) References Cited

U.S. PATENT DOCUMENTS

| | | |
|---|---|---|
| 2011/0111604 A1 | 5/2011 | Kim et al. |
| 2012/0135604 A1 | 5/2012 | Ohto et al. |
| 2014/0284799 A1* | 9/2014 | Katagiri ............ H01L 21/76834 257/750 |
| 2015/0125791 A1 | 5/2015 | Somervell et al. |
| 2016/0133671 A1 | 5/2016 | Fantini et al. |
| 2017/0011960 A1 | 1/2017 | Ko et al. |
| 2019/0119610 A1 | 4/2019 | Ge et al. |

* cited by examiner

METHODS FOR INHIBITING LINE BENDING DURING CONDUCTIVE MATERIAL DEPOSITION, AND RELATED APPARATUS

CROSS-REFERENCE TO RELATED APPLICATION

This application is a divisional of U.S. patent application Ser. No. 16/773,636, filed Jan. 27, 2020, now U.S. Pat. No. 11,270,909, issued Mar. 8, 2022, the disclosure of which application is hereby incorporated in its entirety herein by this reference.

TECHNICAL FIELD

Embodiments of the disclosure relate to the field of microelectronic device design and fabrication. More specifically, embodiments of the disclosure relate to methods for treating conductive material, in conjunction with the deposition thereof on elongate features, to inhibit bending of the elongate features. The disclosure also relates to apparatus (e.g., structures, microelectronic devices, and electronic systems) comprising treated conductive material.

BACKGROUND

Microelectronic device designers often desire to increase the density of features on a given substrate surface area (e.g., on a semiconductor wafer) by reducing the dimensions of the individual features and by reducing the separation distance between neighboring features. At small dimensions, forming particular materials can present challenges. For example, the materials with the potential for the best performance characteristics (e.g., low electrical resistivity) may present formation challenges that are enhanced at small dimensions. Therefore, microelectronic device designers may turn to other materials that can be formed more easily or reliably at small dimensions, even if such other materials do not have the best performance characteristics (e.g., higher electrical resistivity).

Other challenges arise in designing and fabricating microelectronic devices having features and materials in close proximity with one another. For example, features and materials of small dimension and close proximity may be more likely to succumb to external or internal forces, such as forces on or at the surfaces of the features or materials concerned. Such forces may hamper efforts to structure the features and materials.

FIGS. 1A through 1D illustrate the aforementioned challenges. In FIG. 1A, an idealized structure 100 is schematically illustrated in elevational cross-section, while FIG. 1B schematically illustrates the idealized structure 100 from a top, plan, cross-sectional view. The idealized structure 100 includes elongate features 102 extending vertically from a substrate 104. The elongate features 102 are patterned in parallel lines at small pitch (e.g., at small dimension from one point of one of elongate feature 102 to the same point of its neighboring elongate feature 102). The elongate features 102 and openings (e.g., trenches) separating one elongate feature 102 from its neighbor may be at a high aspect ratio (e.g., a high height-to-width ratio) of, e.g., greater than 5:1. For example, the ratio of height H to each of feature width W(F) and trench width W(T) may be greater than 5:1.

A microelectronic device designer may wish to form a coating of a conductive material 106 evenly along all surfaces of the elongate features 102 and on the upper surface of the substrate 104 in the openings (e.g., trenches) between the elongate features 102. Therefore, the microelectronic device designer may, ideally, intend the conductive material 106 to be formed according to the idealized structure 100 of FIG. 1A and FIG. 1B, with each coated elongate feature 102 perfectly parallel to its neighboring coated elongate features 102 and with opposing sidewalls 114 of the conductive material 106 perfectly vertically and consistently spaced from each other.

Turning to FIG. 1C and FIG. 1D, illustrated is the more realistic result of the microelectronic device designer's efforts to form the coating of the conductive material 106. A more realistic structure 108 may not include perfectly-parallel elongate features 102, with perfectly vertical opposing sidewalls 114 as in FIG. 1B, but, rather, bent features 110 in which opposing sidewalls 114 physically contact one another with the conductive material 106 of one bent feature 110 physically contacting the conductive material 106 of a neighboring bent feature 110, forming contact points (referred to herein as "pinch points," such as pinch points 112 illustrated in FIG. 1D) where the opposing sidewalls 114 are in direct physical contact.

The bending and resulting pinch points 112 may be the result of the interaction of surfaces forces during the formation of the conductive material 106. For example, the conductive material 106 may exhibit attractive or cohesive surface forces during deposition, and, at such small dimensions and high aspect ratios, neighboring structures may succumb to the forces and bend toward one another to form one of the pinch points 112. These pinch points 112 may prevent subsequent fabrication processes, such as those intended to electrically isolate each of the elongate features 102 (and the conductive material 106 thereon) from its neighbor. For example, ideally, the idealized structure 100 of FIG. 1A and FIG. 1B may be further processed to selectively remove (e.g., etch) conductive material 106 from between each of the elongate features 102, so that the conductive material 106 on one of the elongate features 102 is physically and electrically isolated from the conductive material 106 on a neighboring one of the elongate features 102. However, in actuality, the presence of the pinch points 112 of the more realistic structure 108 of FIG. 1C and FIG. 1D may inhibit, prevent, or at least complicate efforts to remove (e.g., etch) conductive material 106 from between neighboring bent features 110.

Not all conductive materials 106 may exhibit the same attractive or cohesive surface forces during formation. Therefore, a microelectronic device designer may resort to selecting, as the conductive material 106, a material that does not exhibit these forces during formation rather than a material that does exhibit these forces. However, where the latter material would exhibit a lower electrical resistivity than the former, the microelectronic device designer's choice sacrifices fabrication and structural reliability over electrical performance. Accordingly, material selection and device performance takes a back seat to device fabrication reliability.

Accordingly, microelectronic device designers continue to battle challenges in the fabrication of microelectronic devices having closely-arranged, high-aspect-ratio features on which another material (e.g., the conductive material 106) is formed.

DETAILED DESCRIPTION

Figure 1A:
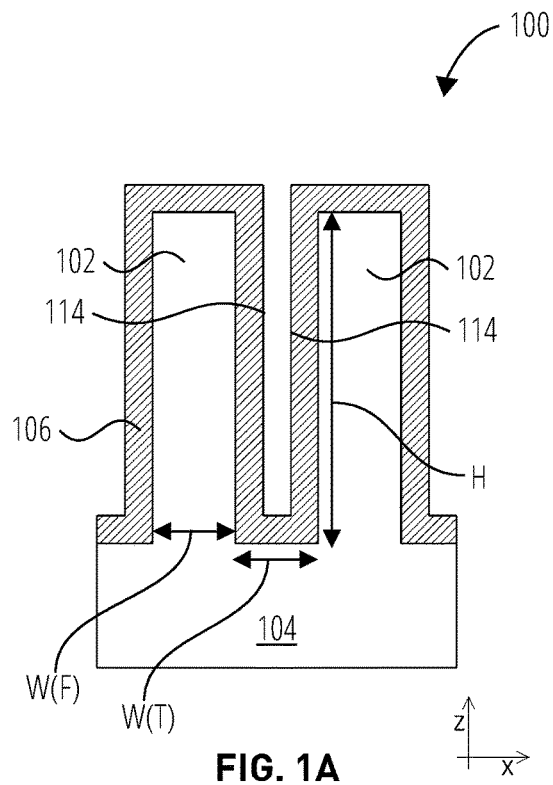
FIG. 1A is a cross-sectional, elevational, schematic illustration of an idealized structure for a microelectronic device.

Methods, according to embodiments of the disclosure, include at least one surface treatment conducted in conjunction with (e.g., before, during, and/or after) deposition of a conductive material on elongate features. The surface treatment reduces attractive or cohesive forces at an exterior surface of the conductive material. Therefore, opposing surfaces of the conductive material are inhibited or prevented from bending toward one another to form pinch points. Accordingly, structures (e.g., microelectronic device structures), apparatus (e.g., microelectronic devices, such as memory devices), and systems (e.g., electronic systems), may be formed by methods that enable use of conductive material(s)—such as conductive material(s) with low electrical resistivity—that might otherwise not be usable if such conductive material(s) would otherwise cause bending and pinch points during fabrication.

As used herein, the term "in conjunction with," when used with respect to a surface treatment and a material-formation act (e.g., material formation, such as deposition), means and refers to the surface treatment and the material-formation being performed in close time proximity with one another or concurrently. For example, a surface treatment conducted "in conjunction with" a material deposition means and includes the surface treatment being carried out before (e.g., immediately before) the material deposition, concurrently with (e.g., during) the material deposition, and/or after (e.g., immediately after) the material deposition. To continue the example, the surface treatment conducted "in conjunction with" the material deposition also means and includes the surface treatment and the material deposition being carried out in one or more repeated acts, some of which may be before, during, or after the other. In some embodiments, a surface treatment conducted "in conjunction with" a material deposition means and includes the surface treatment being carried out any time between (a) forming or otherwise providing a structure upon which the material is to be deposited as the next-deposited material (e.g., after fully completing forming of elongate features (e.g., after patterning, such as by etching, of a structure to form elongated features and any related cleaning or drying acts)) and (b) forming another material of a different characteristic (e.g., a nonconductive material, rather than a conductive material) than the material formed by the material-formation act that is "in conjunction with" the surface treatment. In some embodiments, a surface treatment conducted "in conjunction with" a material deposition means and includes the surface treatment conducted at any time or times between (a) the introduction of a structure into a deposition chamber in which the material deposition is to be conducted and (b) the removal of the structure from the deposition chamber after completing the material deposition.

As used herein, the term "species" means and includes an element or elements (e.g., molecule(s), chemical group(s)) composing or derived from a material or composition. As nonlimiting examples, in a composition comprising $SiH_4$, each of silicon (Si) and hydrogen (H) may be referred to herein as a species of the $SiH_4$; in a composition comprising $C_8H_{24}N_4Ti$, each of carbon (C), hydrogen (H), nitrogen (N), and titanium (Ti) may be referred to herein as a species of the $C_8H_{24}N_4Ti$; in a composition comprising $TiCl_4$, each of Ti and chlorine (Cl) may be referred to herein as a species of the $TiCl_4$; and in a composition comprising $BCl_3$, each of boron (B) and Cl may be referred to herein as a species of the $BCl_3$, regardless of whether such species are, at the time of references, presently within the originating material or composition or, instead, within or on another material or composition.

As used herein, the term "treatment species" means and includes a species derived from a composition formulated for a surface treatment.

As used herein, the term "trace species" means and includes an element or elements, such as atoms or molecules, derived from one material or composition to be present on or within a volume of another material(s) in a trace amount, e.g., an atomic fraction (atoms of the trace (e.g., treatment) species relative to atoms of other species within the other material(s)) of from about $1 \times 10^{-8}$ to about $1 \times 10^{-1}$, e.g., from about (0.001 to about 0.01). The trace amount may be determined based on a total volume of material(s) of an identified characteristic (e.g., conductive material(s)) of a structure or region (e.g., a discrete region) of the structure, though the trace (e.g., treatment) species may be, e.g., concentrated at or near a surface of the material(s), concentrated at or near an interface between portions of the material(s), and/or dispersed throughout the volume (e.g., of the structure or the region of the structure).

As used herein, the term "opening" means a volume extending through at least one structure or at least one material, leaving a gap in that at least one structure or at least one material, or a volume extending between structures or materials, leaving a gap between the structures or materials. Unless otherwise described, an "opening" is not necessarily empty of material. That is, an "opening" is not necessarily void space. An "opening" formed in or between structures or materials may comprise structure(s) or material(s) other than that in or between which the opening is formed. And, structure(s) or material(s) "exposed" within an opening is (are) not necessarily in contact with an atmosphere or non-solid environment. Structure(s) or material(s) "exposed" within an opening may be adjacent or in contact with other structure(s) or material(s) that is (are) disposed within the opening.

As used herein, the term "substrate" means and includes a base material or other construction upon which components, such as those within memory cells, are formed. The substrate may be a semiconductor substrate, a base semiconductor material on a supporting structure, a metal electrode, or a semiconductor substrate having one or more materials, structures, or regions formed thereon. The substrate may be a conventional silicon substrate or other bulk substrate including a semiconductive material. As used herein, the term "bulk substrate" means and includes not only silicon wafers, but also silicon-on-insulator ("SOI") substrates, such as silicon-on-sapphire ("SOS") substrates or silicon-on-glass ("SOG") substrates, epitaxial layers of silicon on a base semiconductor foundation, or other semiconductor or optoelectronic materials, such as silicon-germanium ($Si_{1-x}Ge_x$, where x is, for example, a mole fraction between 0.2 and 0.8), germanium (Ge), gallium arsenide (GaAs), gallium nitride (GaN), or indium phosphide (InP), among others. Furthermore, when reference is made to a "substrate" in the following description, previous process stages may have been utilized to form materials, structures, or junctions in the base semiconductor structure or foundation.

As used herein, the terms "horizontal" or "lateral" mean and include a direction that is parallel to a primary surface of the substrate on which the referenced material or structure is located. The width and length of a respective material or structure may be defined as dimensions in a horizontal plane. With reference to the figures, the "horizontal" direction may be perpendicular to an indicated "Z" axis and may be parallel to an indicated "X" axis, an indicated "Y" axis, and/or "XY" plane. These terms may be used for ease of description to describe one element's or feature's relationship to another element(s) or feature(s) as illustrated in the figures. Unless otherwise specified, the spatially relative terms are intended to encompass different orientations of the elements and features in addition to the orientation as depicted in the figures. For example, if materials in the figures are rotated about ninety degrees, elements described as "horizontal" or "lateral" would then be oriented vertically or longitudinally. Thus, the terms "horizontal" and "lateral" may encompass both an orientation as illustrated in the figures as well as an orientation of the figure illustrations rotated ninety degrees clockwise or counterclockwise, depending on the context in which the term is used, which will be evident to one of ordinary skill in the art. The materials may be otherwise oriented (rotated more or less than ninety degrees, inverted, etc.) and the spatially relative descriptors used herein interpreted accordingly.

As used herein, the terms "vertical" or "longitudinal" mean and include a direction that is perpendicular to a primary surface of the substrate on which a referenced material or structure is located. The height of a respective material or structure may be defined as a dimension in a vertical plane. With reference to the figures, the "vertical" direction may be that along an indicated "Z" axis. These terms may be used for ease of description to describe one element's or feature's relationship to another element(s) or feature(s) as illustrated in the figures. Unless otherwise specified, the spatially relative terms are intended to encompass different orientations of the elements and features in addition to the orientation as depicted in the figures. For example, if materials in the figures are rotated about ninety degrees, elements described as "vertical" or "longitudinal" would then be oriented horizontally or laterally. Thus, the terms "vertical" and "longitudinal" may encompass both an orientation as illustrated in the figures as well as an orientation of the figure illustrations rotated ninety degrees clockwise or counterclockwise, depending on the context in which the term is used, which will be evident to one of ordinary skill in the art. The materials may be otherwise oriented (rotated more or less than ninety degrees, inverted, etc.) and the spatially relative descriptors used herein interpreted accordingly.

As used herein, the terms "thickness" or "thinness" mean and include a dimension in a straight-line direction that is normal to the closest surface of an immediately adjacent material or structure that is of a different composition or that is otherwise distinguishable from the material or structure whose thickness, thinness, or height is discussed.

As used herein, the term "between" is a spatially relative term used to describe the relative disposition of one material, structure, or sub-structure relative to at least two other materials, structures, or sub-structures. The term "between" may encompass both a disposition of one material, structure, or sub-structure directly adjacent the other materials, structures, or sub-structures and a disposition of one material, structure, or sub-structure indirectly adjacent to the other materials, structures, or sub-structures.

As used herein, the term "proximate" is a spatially relative term used to describe disposition of one material, structure, or sub-structure near to another material, structure, or sub-structure. The term "proximate" includes dispositions of indirectly adjacent to, directly adjacent to, and internal to.

As used herein, the term "neighboring," when referring to a material or structure, means and refers to a next, most proximate material or structure of an identified composition or characteristic. Materials or structures of other compositions or characteristics than the identified composition or characteristic may be disposed between one material or structure and its "neighboring" material or structure of the identified composition or characteristic. For example, a structure of material X "neighboring" a structure of material Y is the first material X structure, e.g., of multiple material X structures, that is next most proximate to the particular structure of material Y. The "neighboring" material or structure may be directly or indirectly proximate the structure or material of the identified composition or characteristic.

As used herein, the terms "about" and "approximately," when either is used in reference to a numerical value for a particular parameter, are inclusive of the numerical value and a degree of variance from the numerical value that one of ordinary skill in the art would understand is within acceptable tolerances for the particular parameter. For example, "about" or "approximately," in reference to a numerical value, may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, the term "substantially," when referring to a parameter, property, or condition, means and includes the parameter, property, or condition being equal to or within a degree of variance from a given value such that one of ordinary skill in the art would understand such given value to be acceptably met, such as within acceptable manufacturing tolerances. By way of example, depending on the particular parameter, property, or condition that is substantially met, the parameter, property, or condition may be "substantially" a given value when the value is at least 90.0% met, at least 95.0% met, at least 99.0% met, or even at least 99.9% met.

As used herein, reference to an element as being "on" or "over" another element means and includes the element being directly on top of, adjacent to (e.g., laterally adjacent to, vertically adjacent to), underneath, or in direct contact with the other element. It also includes the element being indirectly on top of, adjacent to (e.g., laterally adjacent to, vertically adjacent to), underneath, or near the other element, with other elements present therebetween. In contrast, when an element is referred to as being "directly on" or "directly adjacent to" another element, there are no intervening elements present. Also, as used herein, reference to an element (e.g., a species) as being "on" or "over" another element (e.g., a material) means and includes the element (e.g., the species) being in (e.g., intercalated) the other element (e.g., the material).

As used herein, other spatially relative terms, such as "below," "lower," "bottom," "above," "upper," "top," and the like, may be used for ease of description to describe one element's or feature's relationship to another element(s) or feature(s) as illustrated in the figures. Unless otherwise specified, the spatially relative terms are intended to encompass different orientations of the materials in addition to the orientation as depicted in the figures. For example, if materials in the figures are inverted, elements described as "below" or "under" or "on bottom of" other elements or features would then be oriented "above" or "on top of" the other elements or features. Thus, the term "below" may encompass both an orientation of above and below, depending on the context in which the term is used, which will be evident to one of ordinary skill in the art. The materials may be otherwise oriented (rotated ninety degrees, inverted, etc.) and the spatially relative descriptors used herein interpreted accordingly.

As used herein, the terms "comprising," "including," "having," and grammatical equivalents thereof are inclusive or open-ended terms that do not exclude additional, unrecited elements or method steps, but these terms also include more restrictive terms "consisting of" and "consisting essentially of" and grammatical equivalents thereof. Therefore, a structure described as "comprising," "including," and/or "having" a material may be a structure that, in some embodiments, includes additional material(s) as well and/or a structure that, in some embodiments, does not include any other material(s). Likewise, a composition (e.g., gas) described as "comprising," "including," and/or "having" a species may be a composition that, in some embodiments, includes additional species as well and/or a composition that, in some embodiments, does not include any other species.

As used herein, the term "may" with respect to a material, structure, feature, or method act indicates that such is contemplated for use in implementation of an embodiment of the disclosure and such term is used in preference to the more restrictive term "is" so as to avoid any implication that other, compatible materials, structures, features, and methods usable in combination therewith should or must be excluded.

As used herein, "and/or" includes any and all combinations of one or more of the associated listed items.

As used herein, the singular forms "a," "an," and "the" are intended to include the plural forms as well, unless the context clearly indicates otherwise.

As used herein, the terms "configured" and "configuration" mean and refer to a size, shape, material composition, orientation, and arrangement of a referenced material, structure, assembly, or apparatus so as to facilitate a referenced operation or property of the referenced material, structure, assembly, or apparatus in a predetermined way.

The illustrations presented herein are not meant to be actual views of any particular material, structure, substructure, region, sub-region, device, system, or stage of fabrication, but are merely idealized representations that are employed to describe embodiments of the disclosure.

Embodiments are described herein with reference to cross-sectional illustrations that are schematic illustrations. Accordingly, variations from the shapes of the illustrations as a result, for example, of manufacturing techniques and/or tolerances, are to be expected. Thus, embodiments described herein are not to be construed as limited to the particular shapes or structures as illustrated but may include deviations in shapes that result, for example, from manufacturing techniques. For example, a structure illustrated or described as box-shaped may have rough and/or nonlinear features. Moreover, sharp angles that are illustrated may be rounded. Thus, the materials, features, and structures illustrated in the figures are schematic in nature and their shapes are not intended to illustrate the precise shape of a material, feature, or structure and do not limit the scope of the present claims.

The following description provides specific details, such as material types and processing conditions, in order to provide a thorough description of embodiments of the disclosed apparatus (e.g., devices, systems) and methods. However, a person of ordinary skill in the art will understand that the embodiments of the apparatus and methods may be practiced without employing these specific details. Indeed, the embodiments of the apparatus and methods may be practiced in conjunction with conventional semiconductor fabrication techniques employed in the industry.

The fabrication processes described herein do not form a complete process flow for processing apparatus (e.g., devices, systems) or the structures thereof. The remainder of the process flow is known to those of ordinary skill in the art. Accordingly, only the methods and structures necessary to understand embodiments of the present apparatus (e.g., devices, systems) and methods are described herein.

Unless the context indicates otherwise, the materials described herein may be formed by any suitable technique including, but not limited to, spin coating, blanket coating, chemical vapor deposition ("CVD"), atomic layer deposition ("ALD"), plasma enhanced ALD, physical vapor deposition ("PVD") (e.g., sputtering), or epitaxial growth. Depending on the specific material to be formed, the technique for depositing or growing the material may be selected by a person of ordinary skill in the art.

Unless the context indicates otherwise, the removal of materials described herein may be accomplished by any suitable technique including, but not limited to, etching (e.g., dry etching, wet etching, vapor etching, atomic layer etching), ion milling, abrasive planarization, or other known methods.

Reference will now be made to the drawings, where like numerals refer to like components throughout. The drawings are not necessarily drawn to scale.

By the methods of the disclosure, one or more surface treatments are conducted, in conjunction with (e.g., before, during, and/or after) deposition of conductive material(s) on elongate features, to inhibit or prevent attractive or cohesive forces at surfaces of the conductive material that may otherwise lead to opposing sidewalls coming into contact with one another, bending the elongate structures (e.g., "line bending") and forming pinch points that would hinder subsequent fabrication processes for electrically isolating neighboring regions of the conductive material. Therefore, embodiments of this disclosure may use conductive material(s) that would have otherwise been unusable due to their tendency, with conventional methods, of causing line bending and pinch points that would make the resulting microelectronic devices and systems inoperable. These now-usable conductive material(s) include conductive materials that exhibit low electrical resistivity. Therefore, the present microelectronic device structures include conductive substructures (e.g., control gates) that may exhibit lower electrical resistivity, and therefore improved electrical performance, compared to that of conventional microelectronic device structures.

Figure 2:
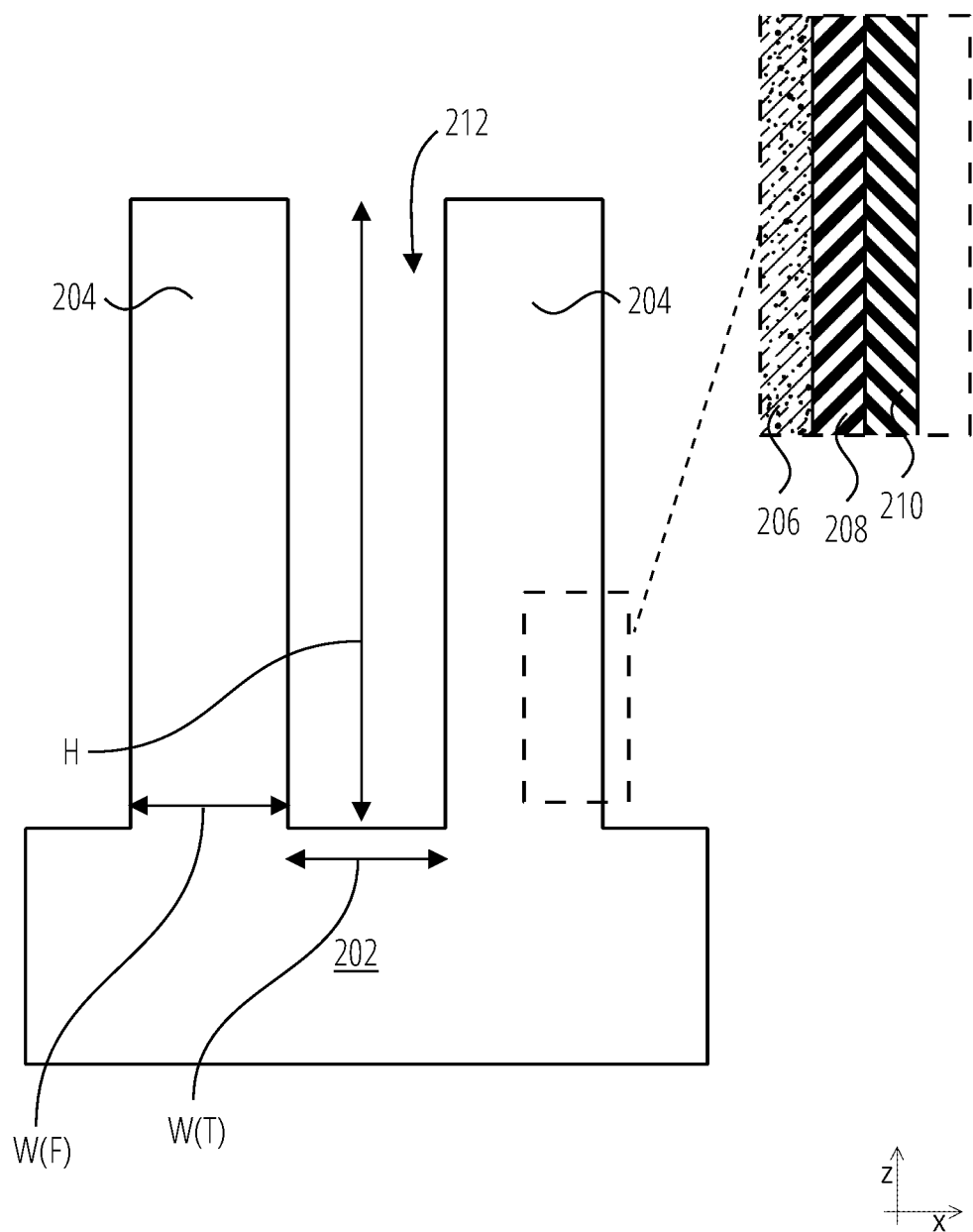
FIG. 2 is a cross-sectional, elevational, schematic illustration during a stage of processing to fabricate a microelectronic device structure, according to embodiments of the disclosure, wherein a structure has been patterned to define elongate features on which conductive material is to be formed, and wherein the dashed box illustration in the upper, right-hand corner of the figure is an enlargement of the corresponding smaller dashed box, according to embodiments of the disclosure.

FIG. 2 illustrates a substrate 202 (e.g., a base structure) that has been patterned to include elongate features 204 extending vertically (e.g., parallel to the indicated "Z" axis). Though FIG. 2 illustrates only two such elongate features 204, the substrate 202 may support any number of the elongate features 204, each of which may be parallel to one or more neighboring elongate features 204.

The substrate 202 may include or consist of any of the base materials or constructions described above. For example, the substrate 202 may include a semiconductor material (e.g., silicon, such as polysilicon).

The elongate features 204 may be formed by patterning (e.g., etching) the substrate 202. Therefore, in some embodiments, the elongate features 204 may include the same material as the substrate 202. In some such embodiments, the elongate features 204 may be free of a liner or other additional material on sidewalls and/or other surfaces of the elongate features 204. In other embodiments, the elongate features 204 may include one or more additional materials. For example, as illustrated in the enlarged dash box of FIG. 2, the elongate features 204 may include a semiconductor 206 on which is formed a gate oxide 208 and, optionally, a liner 210 (e.g., a TiN liner). In other embodiments, the elongate features 204 and/or the substrate 202 may include a hard mask material on one or more surfaces thereof.

Separating neighboring elongate features 204 are openings 212 (e.g., trenches). Each of the openings 212 and the elongate features 204 may have a high aspect ratio. As used herein, a "high aspect ratio" means and includes a height-to-width ratio of at least about 5:1. Therefore, height H may be at least five times the feature width W(F) and at least five times the trench width W(T).

Figure 3:
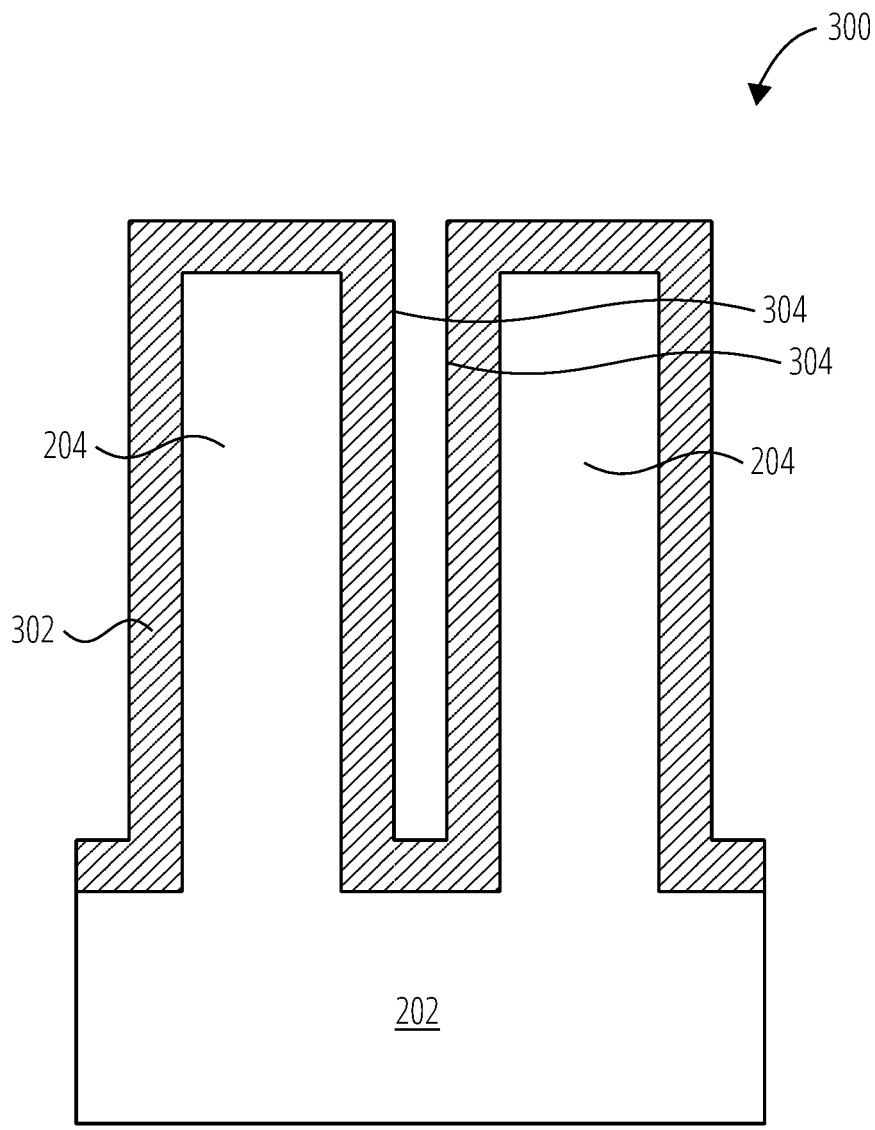
FIG. 3 is a cross-sectional, elevational, schematic illustration during a stage of processing—following that illustrated in FIG. 2—to fabricate a microelectronic device structure, according to embodiments of the disclosure, wherein a coating of conductive material has been formed on the structure of FIG. 2.

As illustrated in FIG. 3, a coated structure 300 is formed by depositing (e.g., by ALD, by CVD, such as plasma-enhanced CVD) conductive material 302 on the elongate features 204 in one or more deposition acts. The conductive material 302 may be conformally formed on all surfaces of the structure of FIG. 2, including on vertical sidewalls of the elongate features 204 and on the upper surfaces of the substrate 202 that were exposed in the openings 212 of FIG. 2.

The conductive material 302 may include one or more metals, metal oxides, metal nitrides, or combinations thereof, such as one or more of ruthenium (Ru), molybdenum (Mo), tungsten (W), silver (Ag), copper (Cu), palladium (Pd), platinum (Pt), rhodium (Rh), oxides of any of the foregoing, nitrides of any of the foregoing, or combinations of any of the foregoing. The conductive material 302 may be formulated or selected to exhibit a relatively low electrical resistivity, such as, e.g., less than about $1\times10^{-6}$ m·Ω.

Figure 1C:
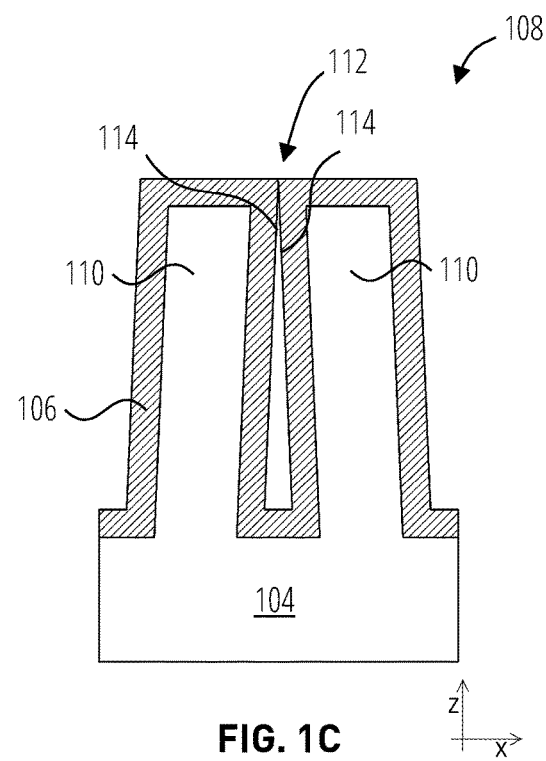
FIG. 1C is a cross-sectional, elevational, schematic illustration of a more realistic structure, compared to that of FIG. 1A, for a microelectronic device.
Figure 1B:
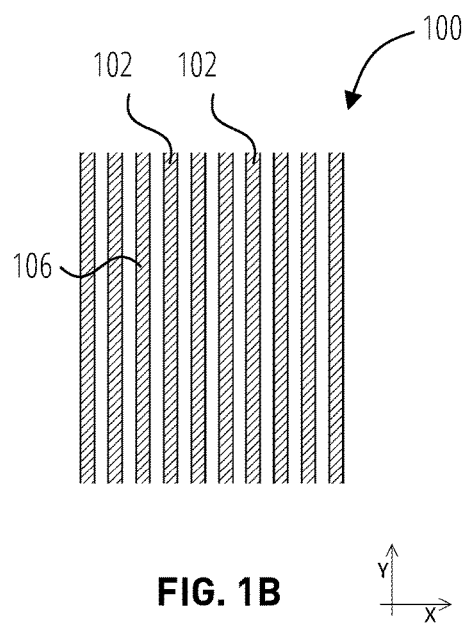
FIG. 1B is a cross-sectional, top plan, schematic illustration of the idealized structure of FIG. 1A, wherein only a top surface thereof is illustrated in cross-section, for ease of visibility.
Figure 1D:
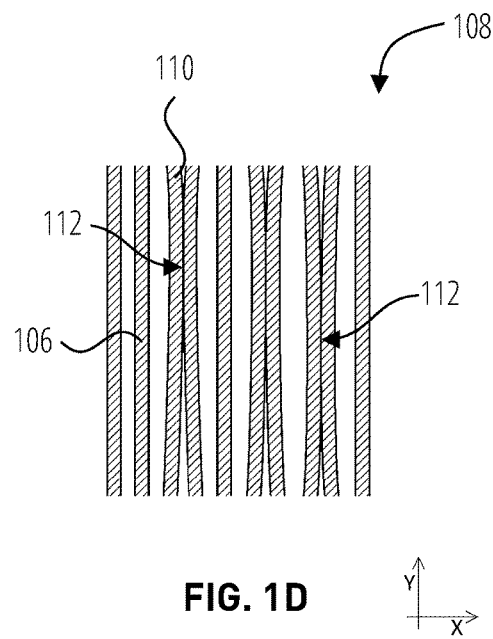
FIG. 1D is a cross-sectional, top plan, schematic illustration of the more realistic structure of FIG. 1C, wherein only a top surface thereof is illustrated in cross-section, for ease of visibility.

Due to the surface treatment methods discussed further below, the conductive material 302 is deposited on the elongate features 204 in such a manner that diminishes or neutralizes the strength of attractive or cohesive forces that would otherwise be present at opposing sidewalls 304 of the conductive material 302. The diminished or neutralized surface forces may, therefore, not cause the opposing sidewalls 304 to move toward one another and bend the underlying elongate features 204 and cause pinch points 112 (see FIG. 1C and FIG. 1D).

Figure 4:
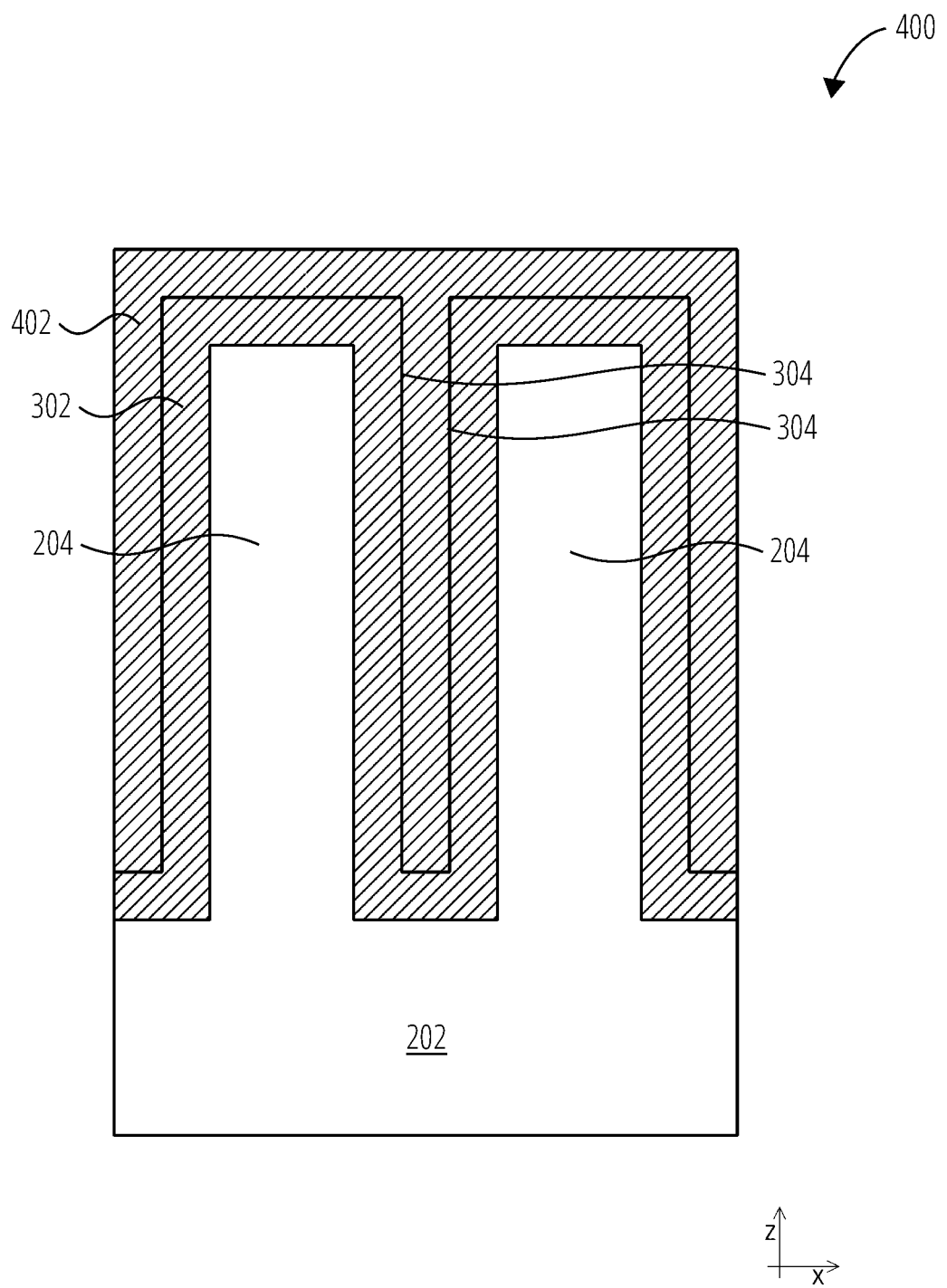
FIG. 4 is a cross-sectional, elevational, schematic illustration during a stage of processing—following that illustrated in FIG. 3—to fabricate a microelectronic device structure, according to embodiments of the disclosure, wherein additional conductive material has been formed on the structure of FIG. 3 to fill openings (e.g., trenches) between elongate features.

With reference to FIG. 4, a filled structure 400 may, in some embodiments, be formed by depositing additional conductive material 402—comprising or consisting of any of the aforementioned materials for the conductive material 302—by one or more additional deposition acts, on the conductive material 302 to fill the volume between neighboring elongate features 204. In embodiments in which the conductive material 302 was formed in conjunction with surface treatments, the filling by the additional conductive material 402 may be more reliably carried out, compared to methods without the surface treatments. That is, without the surface treatments, line bending and pinch points may be formed with the opposing sidewalls 304 contacting one another, which may also leave voids under the pinch points 112 (see, e.g., FIG. 1C and FIG. 1D). The pinch points 112 may prevent the additional conductive material 402 from completely filling the volume between the neighboring elongate features 204. Accordingly, forming the conductive material 302 in conjunction with the surface treatments of embodiments of the disclosure not only inhibits line bending and pinch point formation, but may also improve the reliability of forming fully-filled structures, such as the filled structure 400 with conductive material (e.g., the conductive material 302 and the additional conductive material 402) fully filling the volume between the elongate features 204.

In some embodiments, the additional conductive material 402 may be formed in conjunction with one or more surface treatments. Therefore, both the conductive material 302 and the additional conductive material 402 may be formed (e.g., deposited) in conjunction with surface treatments. Alternatively, only one of the conductive material 302 and the additional conductive material 402 may be formed (e.g., deposited) in conjunction with surface treatments.

The surface treatments of the methods of this disclosure include introducing (e.g., into a deposition chamber) surface treatment gas(es) to the surfaces of a structure, such as the surfaces of the elongate features 204 (e.g., the structure of FIG. 2) and/or the surfaces of already-formed conductive material 302. The surface treatment gas(es) are formulated to provide a treatment species (e.g., atom(s), molecule(s), and/or chemical group(s)) to the surfaces exposed to the gas. Therefore, the surface treatment gas(es) comprise and are formulated to provide treatment species (e.g., atom(s), molecule(s), chemical group(s)) that reduce the surface energy of the conductive material 302 (e.g., an already-formed conductive material, a concurrently-formed conductive material, or a subsequently-formed conductive material). The surface treatment gas(es) may include and/or provide (e.g., as the treatment species) metal halides, metal hydrides, organometallics, Lewis acids, halogens, hydrogen, or a combination of any of the foregoing. In some embodiments, the surface treatment gas(es) may additionally or alternatively include polar molecules formulated to provide charge species that modify surface charges to that of the opposite native polarity (e.g., of the depositing conductive material surface).

It is contemplated that the presence of the treatment species on the surfaces diminish (e.g., reduce) or negate attractive or cohesive forces along or in the surfaces. For example, prior to introduction of the surface treatment gas(es), the outer surfaces of a structure may exhibit attractive or cohesive forces (e.g., Van der Waals forces, covalent forces, ionic forces, surface energy forces, and/or electrostatic forces) that could, if left unaffected, lead to line bending and pinch points, as described above. After exposing the surfaces to the surface treatment gas(es), the introduction of the treatment species from the surface treatment gas(es) onto or into the surfaces may diminish or neutralize the strength of the attractive or cohesive forces so that treated, neighboring surfaces (e.g., opposing sidewalls) will not bend toward one another (e.g., causing line bending and/or pinch points). Additionally or alternatively, subsequent or concurrent material formation (e.g., growth or deposition of the conductive material 302) may be influenced, at least in part, by the surface(s) having been, or being, subject to the surface treatment, the influence being such that attractive or cohesive forces that may otherwise have formed may be avoided or diminished so that the subsequently or concurrently-formed material (e.g., the conductive material 302) will not bend toward neighboring portions of the material (e.g., causing line bending and/or pinch points).

In some embodiments, the surface treatment gas may comprise one or more of $SiH_4$ (a source for, e.g., silicon (Si) treatment species); $C_8H_{24}N_4Ti$ ("TDMAT") (a source for, e.g., carbon (C), hydrogen (H), nitrogen (N), and/or titanium (Ti) treatment species); $TiCl_4$ (a source for, e.g., chlorine (Cl) treatment species); $BCl_3$ (a source for, e.g., chlorine (Cl) treatment species); carbon monoxide (CO) (a source for carbon (C), and/or oxygen (O) treatment species); hydrogen gas ($H_2$) (a source for hydrogen (H) treatment species); or mixtures or combinations of any of the foregoing (e.g., $SiH_4$ within $TiCl_4$). The surface treatment gas may, optionally, include one or more inert carrier gases (e.g., xenon (Xe) gas, fluorine (F), krypton (Kr) gas, argon (Ar) gas, or mixtures of any thereof).

The surface treatment may be conducted (e.g., the surface treatment gas(es) may be introduced) at at least one stage between completion of the formation (or provision) of the patterned structure of elongate features 204, such as that of FIG. 2, and completion of the formation of the conductive material 302 or soon thereafter (e.g., before additional material is formed over the conductive material 302).

Figure 5:
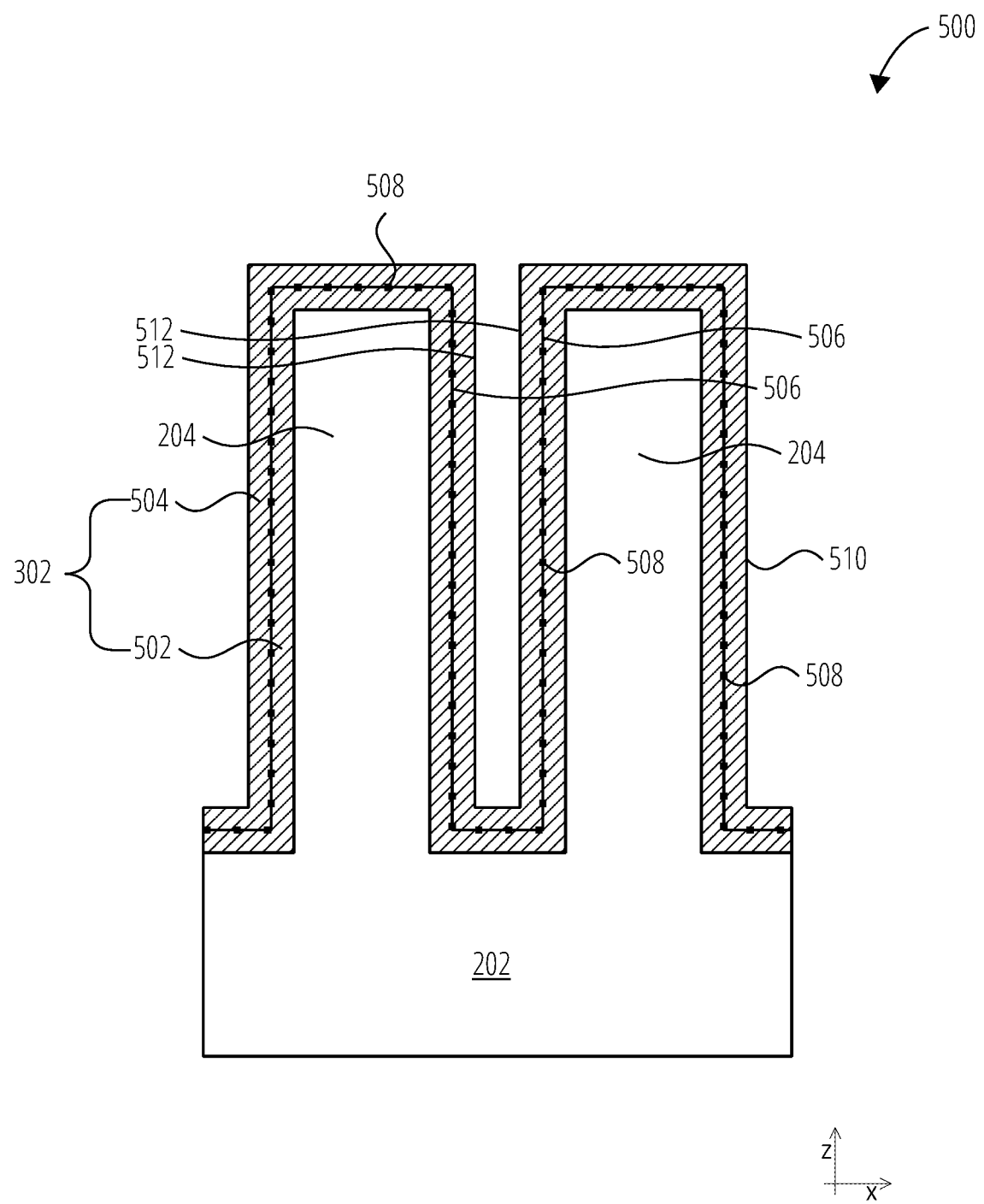
FIG. 5 is a cross-sectional, elevational, schematic illustration during the stage of processing of FIG. 3, according to embodiments of the disclosure wherein a surface treatment is performed between depositions of portions of conductive material.

In some embodiments, such as that of FIG. 5, the surface treatment may be carried out during formation of the conductive material 302, such as between depositions of portions of the conductive material 302. For example, forming a structure 500, like the coated structure 300 of FIG. 3, may include forming (e.g., depositing) a first portion 502 of the conductive material 302 on the elongate features 204, conducting one or more surface treatments as described above, and then forming (e.g., depositing) a second portion 504 of the conductive material 302 on the first portion 502. The conductive material 302 of the first portion 502 and the second portion 504 may be the same or different conductive materials, each selected from the conductive materials described above. The first portion 502 and the second portion 504 of the conductive material 302 may each individually substantially conform to a topography of the structures and/or materials directly thereunder.

In this or other embodiments of the disclosure, the conductive material (e.g., the conductive material 302) may be formed in one or more portions (e.g., the first portion 502, the second portion 504) by one or more deposition acts carried out with the same or different deposition chambers. Moreover, surface treatment(s) may be carried out in the same deposition chamber(s) (e.g., deposition chamber(s) configured for CVD and/or for ALD) used to form the conductive material, or, alternatively, may be carried out in other equipment. For example, with reference to FIG. 5, the first portion 502 may be formed in a deposition chamber, the one or more surface treatments may be performed within the deposition chamber (e.g., with or without ceasing a vacuum condition in the deposition chamber), and then the second portion 504 may be formed in the same deposition chamber (e.g., with or without ceasing a vacuum condition in the deposition chamber). In other embodiments, the first portion 502 may be formed in a deposition chamber, the one or more surface treatments may be performed after removing the structure from the deposition chamber, and then the second portion 504 may be formed with the structure back in the deposition chamber or in another deposition chamber. In these or other embodiments, the formation of the conductive material (e.g., the first portion 502 and the second portion 504) and the one or more surface treatments may be carried out while the substrate 202 is supported by, and without removing the substrate 202 from, a frame.

Conducting the surface treatment after forming the first portion 502 of the conductive material 302 exposes the outer surface of the first portion 502, including first opposing sidewalls 506, to the surface treatment gas(es). The surface treatment gas(es) may leave treatment species 508 (e.g., one or more of the treatment species described above, depending upon the composition of the surface treatment gas(es)) on or in the exposed surfaces, including on or in the first opposing sidewalls 506. The treatment species 508 may, at least initially, form (e.g., deposit, adhere) on or in the exposed surfaces in an amount that occupies from about 0.1% to about 100% of the surface area of the exposed surface(s). In some embodiments, the surface treatment gas(es) may form a monolayer (e.g., a fully-saturated monolayer) of the treatment species on the exposed surfaces. Such a monolayer may substantially cover the exposed surfaces. In some such embodiments, after completing the formation of the conductive material 302 (or conductive materials), the amount of the treatment species relative to the bulk volume of the conductive material(s) 302 may constitute a trace amount. In these or other embodiments, the treatment species—after completion of formation of the conductive material 302 and all surface treatment(s)—may be present on or in the conductive material 302 (e.g., on or in surface(s) of the conductive material 302) in trace or greater amounts.

The surface treatment diminishes or neutralizes what would otherwise be attractive or cohesive forces on the first opposing sidewalls 506 of the first portion 502 of the conductive material 302. Therefore, the conductive material 302 of the first portion 502 may not effectuate line bending or pinch points, enabling the second portion 504 of the conductive material 302 to be reliably formed conformally on the first portion 502, even within the depths of the narrow trenches between the first opposing sidewalls 506. The treatment species 508 may, in some embodiments, remain along an interface between the first portion 502 and the second portion 504 of the conductive material 302.

The presence of the treatment species 508 along one surface (e.g., an inner surface) of the second portion 504 of the conductive material 302 may also be effective to diminish or neutralize attractive or cohesive forces that may have otherwise been present on outer surfaces (e.g., second opposing sidewalls 512) of the second portion 504 of the conductive material 302. Therefore, even after formation (e.g., deposition) of the second portion 504, regions of the conductive material 302 on the second opposing sidewalls 512 may not be pulled toward one another, and line bending and pinch points may be avoided.

In some embodiments, remaining open volumes between the second opposing sidewalls 512 are filled with still another portion of the conductive material 302. For example, with reference to FIG. 6, a filled structure 600 may be formed by forming (e.g., depositing), in one or more formation acts, a third (or more) portion 602 of conductive material 302 on the second portion 504 to fill what was open volumes in the trenches between the second opposing sidewalls 512. The third (or more) portion 602 of the conductive material 302 may include any of the aforementioned conductive materials and may be the same or different than either or both of the first portion 502 and the second portion 504 of the conductive material 302.

Before forming the third (or more) portion 602 of the conductive material 302, one or more additional surface treatments may be conducted by exposing the second portion 504 of the conductive material 302 to one or more surface treatment gas(es), which may be the same as or different than the surface treatment gas(es) to which the first portion 502 was exposed. The additional surface treatment(s) introduce additional treatment species 604 (e.g., in trace or greater amounts) on or in the second portion 504. As before, the additional treatment species 604 may include one or more of the aforementioned treatment species, the composition of which depends on the surface treatment gas(es) selected. In the filled structure 600, the treatment species 508 may be disposed along an interface between the first portion 502 and the second portion 504 of the conductive material 302, while the additional treatment species 604 may be disposed along an interface between the second portion 504 and the third (or more) portion 602. The presence of the additional treatment species 604 may facilitate formation (e.g., deposition) of the third (or more) portion 602 with reliability in that line bending and pinch points may be avoided.

Figure 7:
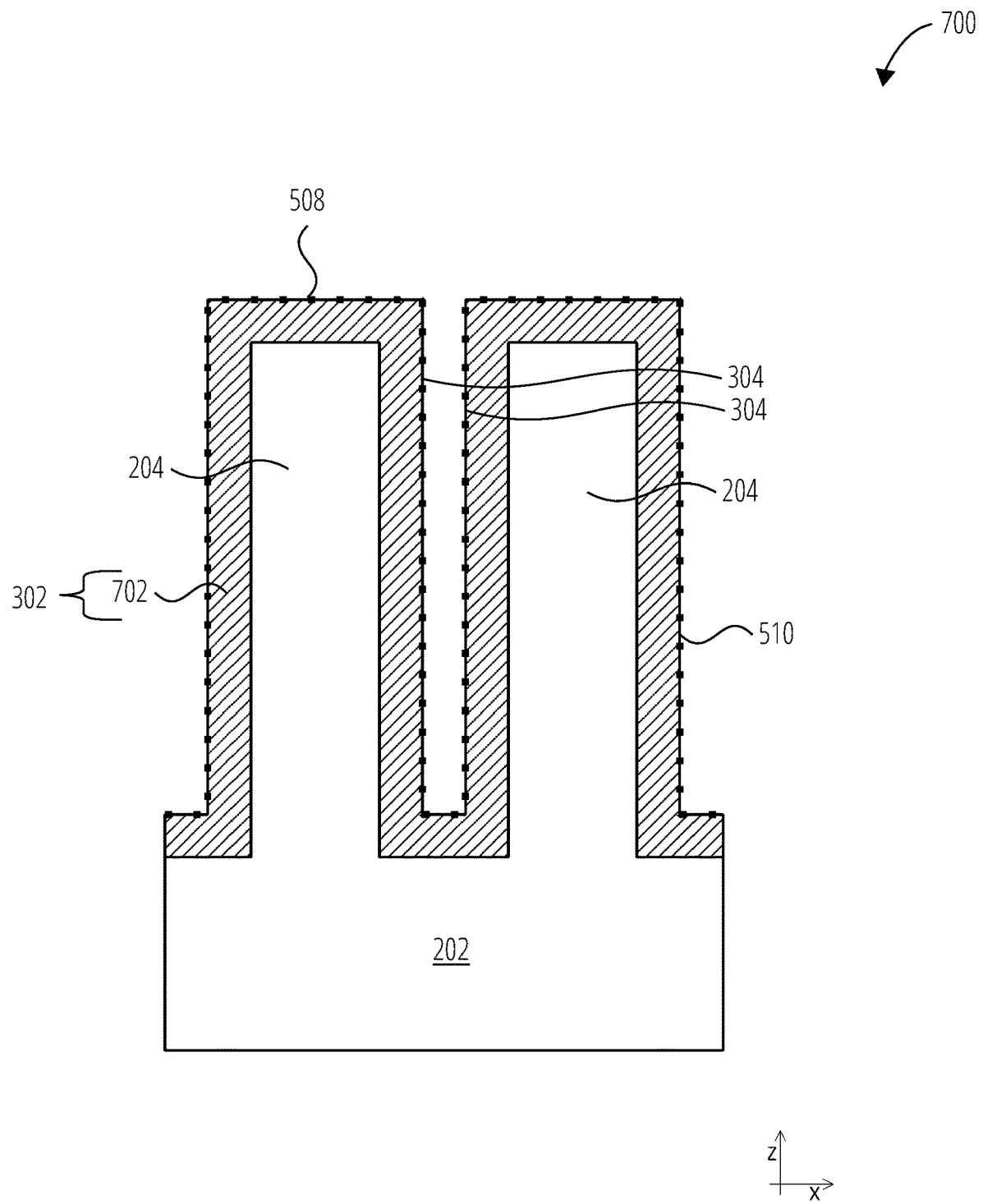
FIG. 7 is a cross-sectional, elevational, schematic illustration during the stage of processing of FIG. 3, according to embodiments of the disclosure wherein a surface treatment is performed after completing deposition of conductive material.

In some embodiments, the surface treatment(s) may be carried out after (e.g., only after or also after) completing formation (e.g., deposition) of the conductive material 302. For example, FIG. 7 illustrates formation of a structure 700 with the conductive material 302 on the elongate features 204. The conductive material 302 may have been formed in one or more deposition acts, to form a portion 702 of the conductive material 302. One or more surface treatment gas(es) may then be introduced, in one or more exposure or introduction acts, to introduce the treatment species 508 on an outer surface 510 of the conductive material 302, including on the opposing sidewalls 304 of the conductive material 302. The presence of the treatment species 508, from the surface treatment(s), may inhibit subsequent mutual attraction of the opposing sidewalls 304 toward one another to avoid line bending and pinch points. The opposing sidewalls 304 may, therefore, remain substantially vertical and substantially evenly spaced along a height thereof. Subsequently, the structure 700 may be subjected to additional material formation or material removal acts with reliable access to even the depths of the trenches between the opposing sidewalls 304.

Figure 8:
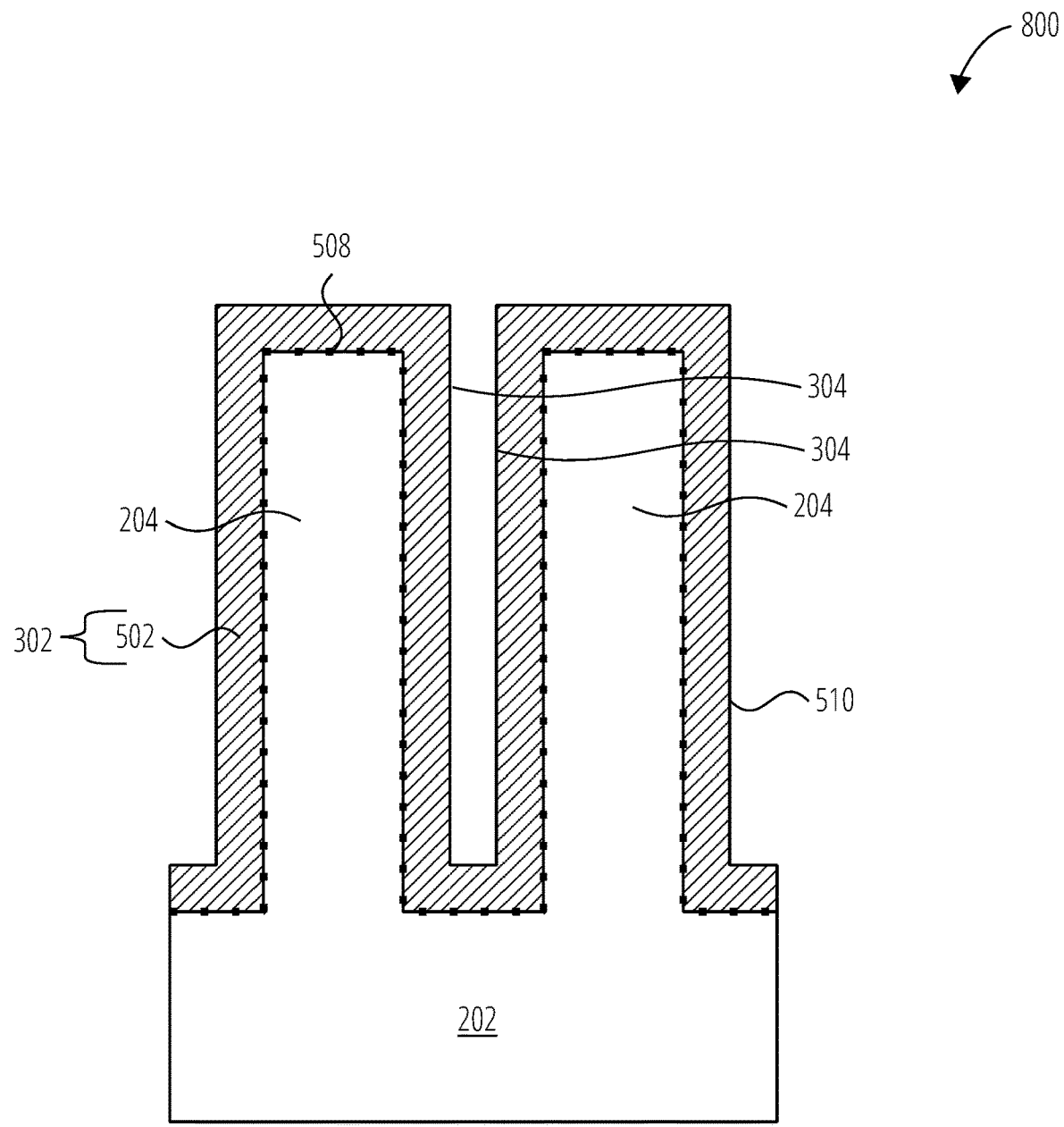
FIG. 8 is a cross-sectional, elevational, schematic illustration during the stage of processing of FIG. 3, according to embodiments of the disclosure wherein a surface treatment is performed prior to deposition of conductive material.

In some embodiments, the surface treatment(s) is be carried out before (e.g., only before or also before) beginning formation (e.g., deposition) of the conductive material 302. For example, FIG. 8 illustrates formation of a structure 800 with the conductive material 302 on the elongate features 204, which conductive material 302 may have been formed in one or more deposition acts to form the portion 702. Prior to formation of the conductive material 302, one or more surface treatment gas(es) may be introduced to exposed surfaces of the elongate features 204 and the substrate 202. This exposure may leave the treatment species 508 on the outer surfaces of the elongate features 204 and the substrate 202. Therefore, in embodiments in which the elongate features 204 include the liner 210 (FIG. 2) on an outer surface, the treatment species 508 may be present on or in the liner 210. In embodiments in which the elongate features 204 do not include a liner on an outer surface, the treatment species 508 may be present on or in the outer surface of the material of the elongate features 204 (e.g., which may be the same material as that of the substrate 202).

After the surface treatment(s) the conductive material 302 may then be formed (e.g., deposited) on the treatment species 508 and the elongate features 204 and substrate 202. The presence of the treatment species 508 along an interface between the conductive material 302 and either of the elongate features 204 and the substrate 202 may be effective to diminish or neutralize attractive or cohesive forces that would otherwise be exhibited on the outer surface 510 of the conductive material 302. Therefore, the conductive material 302 along the opposing sidewalls 304 may not be strongly attracted to one another, and line bending and pinch points may be avoided. As before, the structure 800 may thereafter be subjected to additional material formation or material removal acts with reliable access to even the depths of the trenches between the opposing sidewalls 304.

Figure 6:
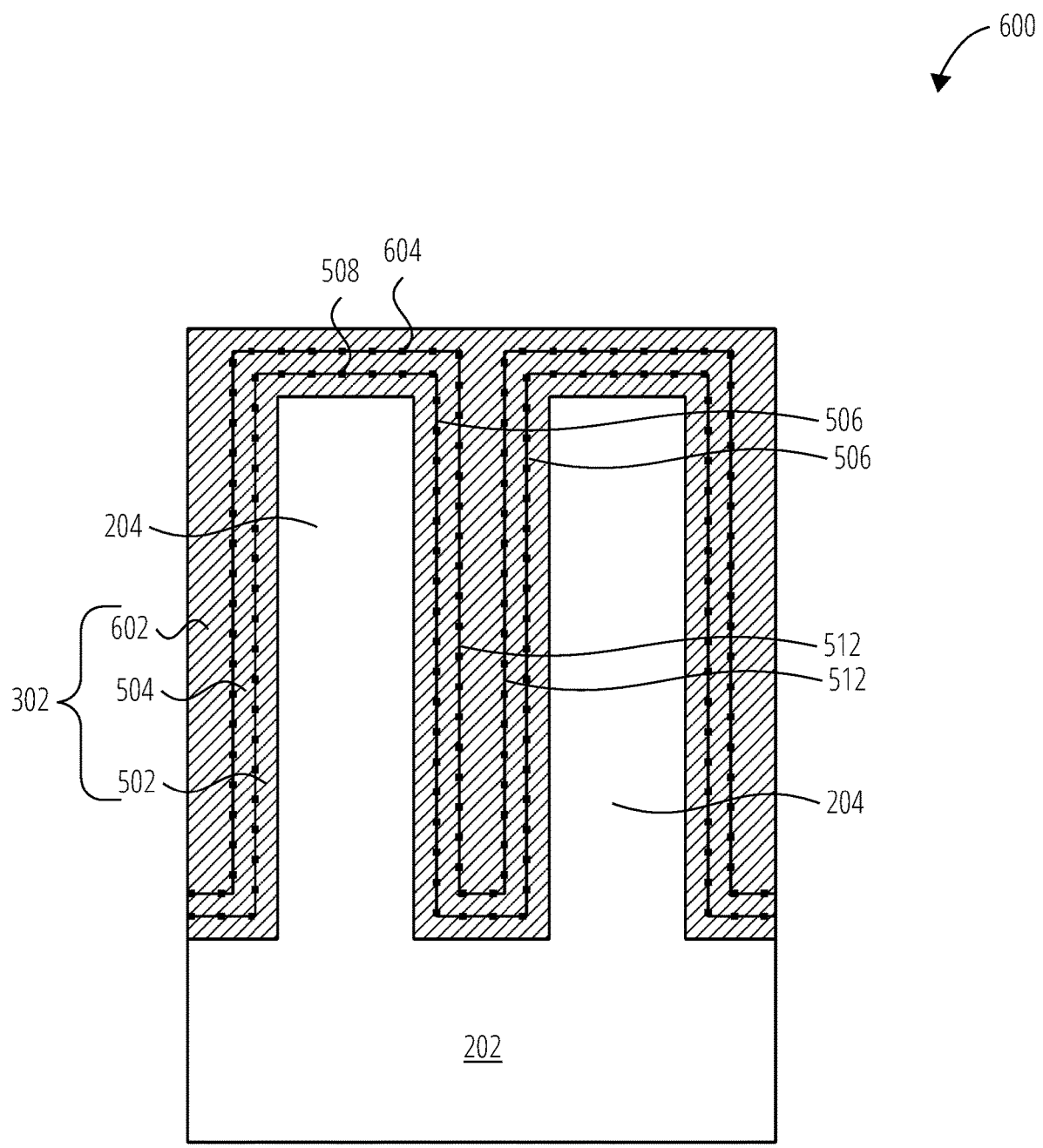
FIG. 6 is a cross-sectional, elevational, schematic illustration during the stage of processing of FIG. 4 and following the stage of processing of FIG. 5, according to embodiments of the disclosure wherein another surface treatment is performed before deposition of an additional portion of conductive material.

It should be recognized that any of the aforementioned methods for forming a structure with a coating of conductive material(s) on the elongate features 204 (e.g., as in FIG. 3, FIG. 5, FIG. 7, and/or FIG. 8) may be subsequently followed by one or more additional conductive material(s) formation (e.g., deposition acts) to form a structure filled with the conductive material(s) between the elongate features 204 (e.g., as in FIG. 4 and/or FIG. 6). And, one or more surface treatment(s) may be conducted before or after any of the conductive material(s) formation acts.

In some embodiments, one or more surface treatment(s) may be conducted (e.g., one or more surface treatment gas(es) may be introduced) even during one or more conductive material(s) formation acts. For example, in any of the aforementioned or subsequently described methods, while the conductive material 302 is being formed (e.g., deposited), the surface treatment gas(es) may be introduced and exposed to the surfaces on which the conductive material 302 is being formed and also exposed to the conductive material 302 as it is deposited. Such during-deposition surface treatment(s) may nonetheless introduce the treatment species (e.g., one or more treatment species described above) to diminish or neutralize the strength of what would otherwise be attractive or cohesive surface forces on an outer surface of the conductive material 302, once formed, and prevent line bending and pinch points. Treatment species (e.g., the treatment species 508, the additional treatment species 604) may be detectable, in trace or greater amounts, on outer surfaces of the conductive material 302. In some embodiments, the treatment species may also be present within (e.g., dispersed within) the volume of the conductive material 302, in trace or greater amounts.

In other embodiments, after formation of the conductive material 302, no treatment species from the surface treatment gas(es) may be detectable. Nonetheless, the exposure of the conductive material 302, or the elongate features 204, to the surface treatment gas(es) may have diminished or neutralized the attractive or cohesive forces that would have otherwise been present on opposing sidewalls of the conductive material 302 during or subsequent to deposition of the conductive material 302.

Accordingly, disclosed is a method of forming a structure. The method comprises forming a pattern of elongate features extending vertically from a base structure. Conductive material is formed on the elongate features. After completing the forming of the pattern of elongate features, the elongate features, the conductive material, or both is (are) exposed to at least one surface treatment gas. The at least one surface treatment gas comprises at least one species formulated to diminish attractive or cohesive forces at a surface of the conductive material.

Figure 9:
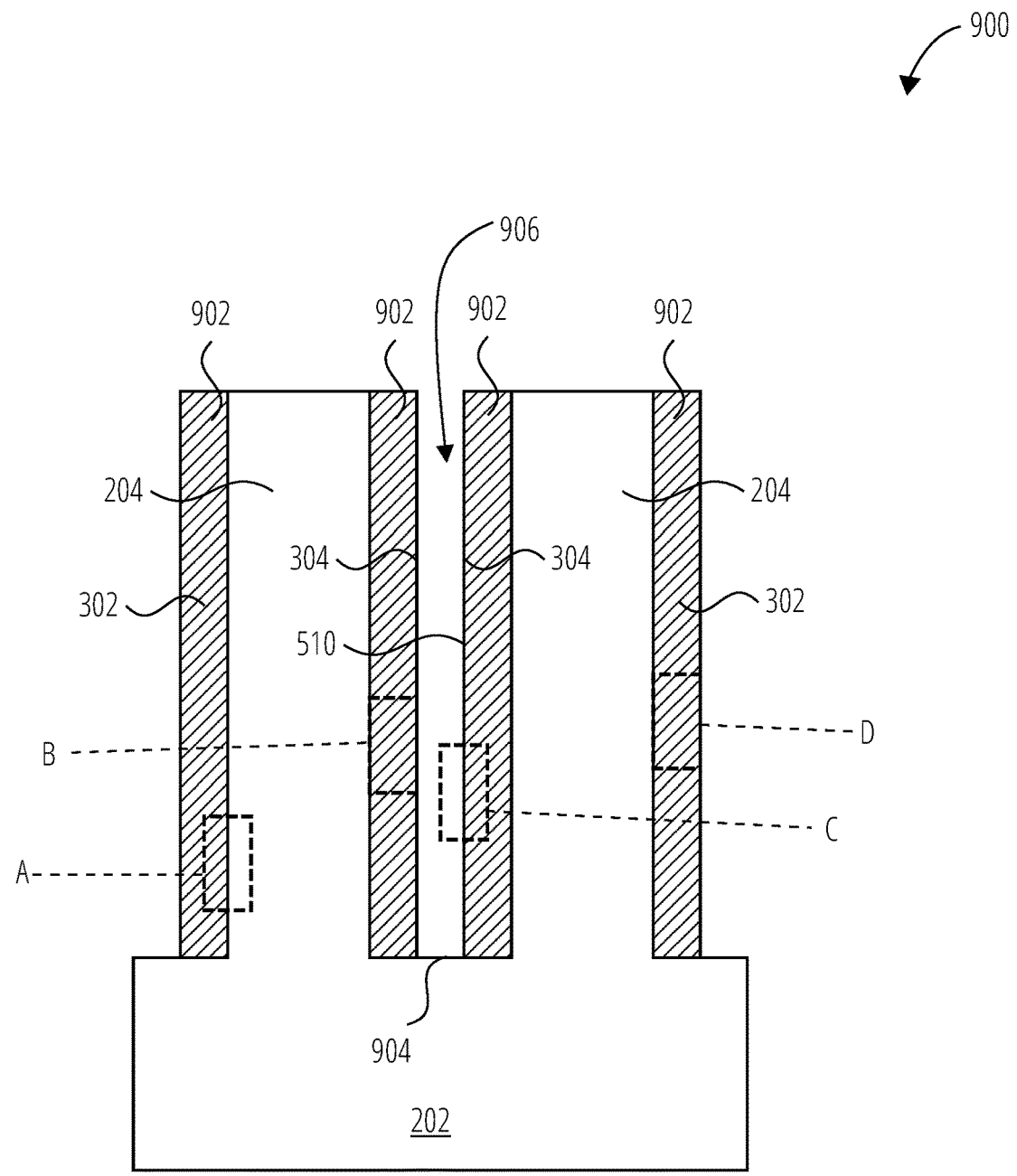
FIG. 9 is a cross-sectional, elevational, schematic illustration of a structure for a microelectronic device and of a stage of processing thereof, according to embodiments of the disclosure, which stage may follow that of any one of FIG. 3, FIG. 5, FIG. 7, or FIG. 8.

After forming the conductive material 302, select portions of the conductive material 302 may be removed to form desired conductive regions. For example, portions of the conductive material 302, e.g., from above the elongate features 204 and from above the substrate 202 between the opposing sidewalls 304 may be selectively removed to electrically isolate neighboring conductive regions formed from the conductive material 302. More particularly, with any of the coated structure 300 of FIG. 3, the structure 500 of FIG. 5, the structure 700 of FIG. 7, or the structure 800 of FIG. 8 (or even, in some embodiments, with the filled structure 400 of FIG. 4 or the filled structure 600 of FIG. 6), portions of the conductive material 302 may be removed—as illustrated in FIG. 9—to form a structure 900 having conductive structures 902 along vertical sidewalls of the elongate features 204 and with the floor 904 of each of the trenches 906 exposing a surface of the substrate 202, and with an upper surface of the elongate features 204 exposed and coplanar with an upper surface of the conductive structures 902. Such a structure as structure 900 may be configured for inclusion in a final microelectronic device structure wherein the conductive structures 902 provide vertical control gates for, e.g., memory devices.

Figure 10:
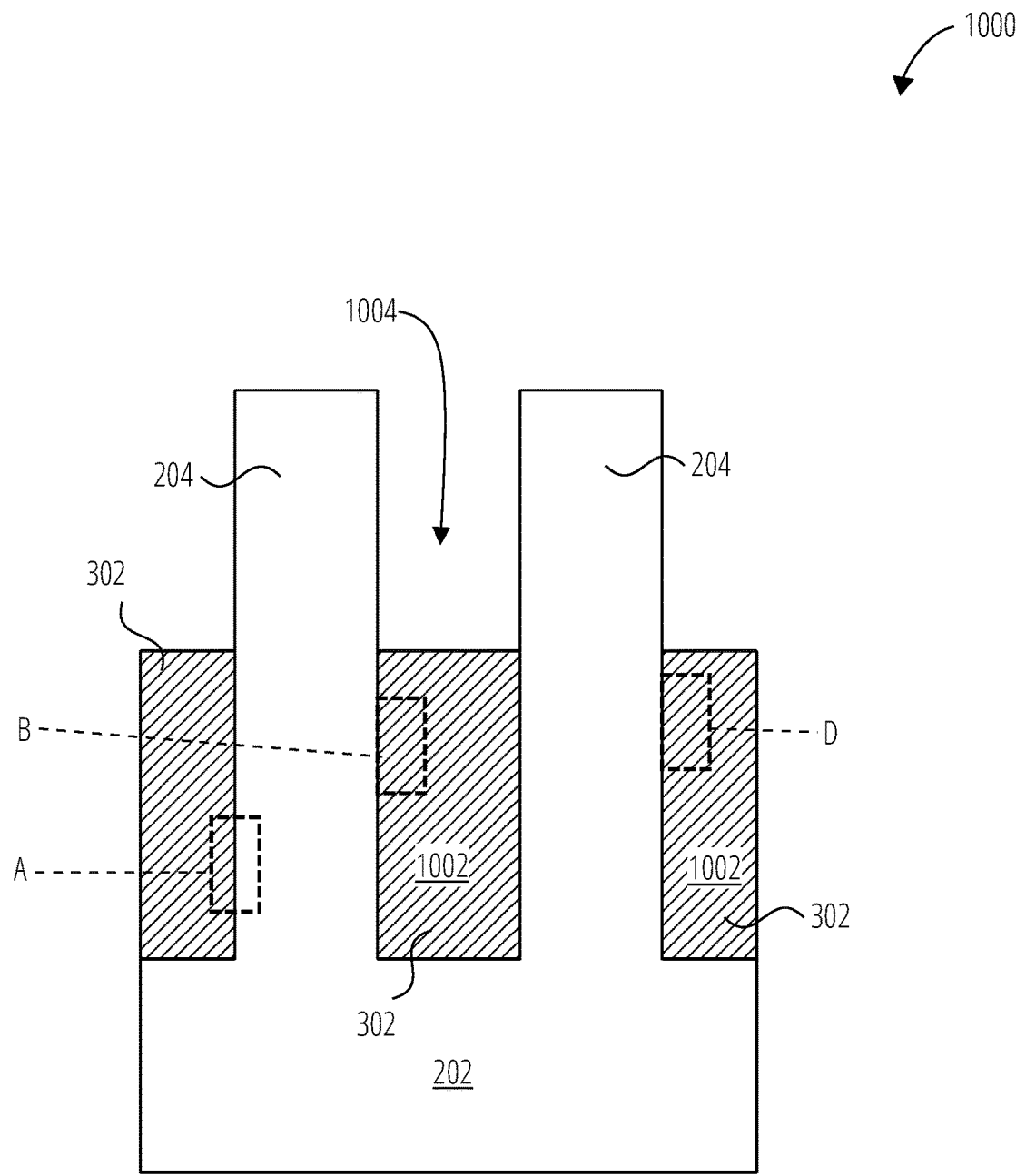
FIG. 10 is a cross-sectional, elevational, schematic illustration of a structure for a microelectronic device and of a stage of processing thereof, according to embodiments of the disclosure, which stage may follow that of any one of FIG. 4 or FIG. 6.

In other embodiments, such as illustrated in FIG. 10, material removal acts subsequent to formation of the conductive material 302 and of the surface treatment act(s) include forming a structure 1000 with conductive structures 1002 occupying the bottom of the volume between neighboring elongate features 204. For example, with any of the filled structure 400 of FIG. 4 or the filled structure 600 of FIG. 6 (or after filling the remaining trench volume between the elongate features 204 of the coated structure 300 of FIG. 3, the structure 500 of FIG. 5, the structure 700 of FIG. 7, or the structure 800 of FIG. 8), upper portions of the conductive material 302 may be removed to form recess 1004 between the elongate features 204. Each of the conductive structures 1002 is physically and electrically isolated from its neighbor. Such a structure as the structure 1000 of FIG. 10 may be configured for inclusion in a final microelectronic device structure wherein the conductive structures 1002 provide recessed control gates for, e.g., memory devices.

Figure 11E:
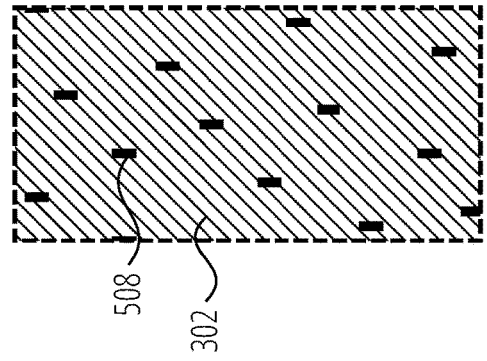
FIG. 11E is an enlarged schematic illustration of dashed box D of either of FIG. 9 or FIG. 10, according to embodiments of the disclosure wherein treatment species are dispersed throughout a volume of conductive material, the treatment species deriving from at least one surface treatment performed before, during, and/or after deposition of conductive material.
Figure 11D:
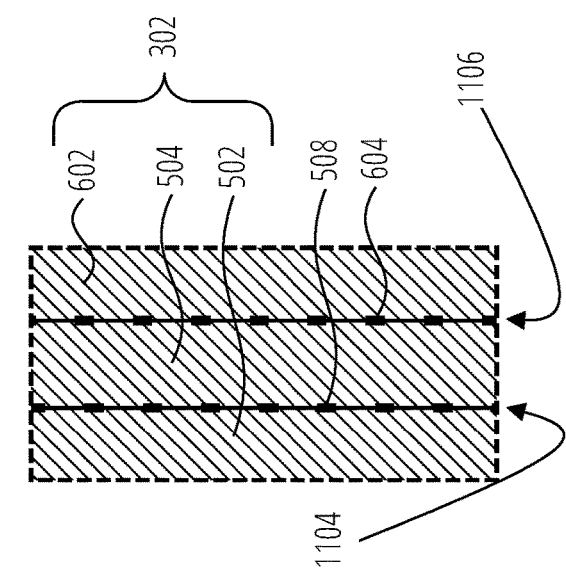
FIG. 11D is an enlarged schematic illustration of dashed box D of either of FIG. 9 or FIG. 10, according to embodiments of the disclosure wherein treatment species are disposed along multiple interfaces between portions of conductive material, the treatment species deriving from multiple surface treatments, at least one of which performed between deposition of portions of the conductive material, as in the fabrication stage of FIG. 6.
Figure 11C:
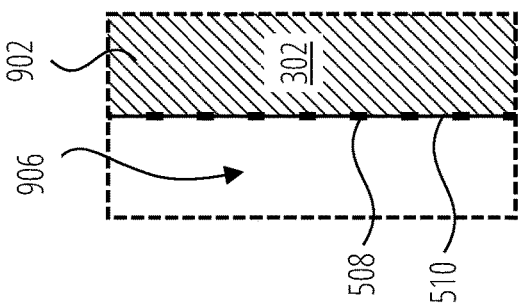
FIG. 11C is an enlarged schematic illustration of dashed box C of FIG. 9, according to embodiments of the disclosure wherein treatment species are disposed along an outer surface of conductive material, the treatment species deriving from a surface treatment performed after deposition of the conductive material, as in the fabrication stage of FIG. 7.
Figure 11B:
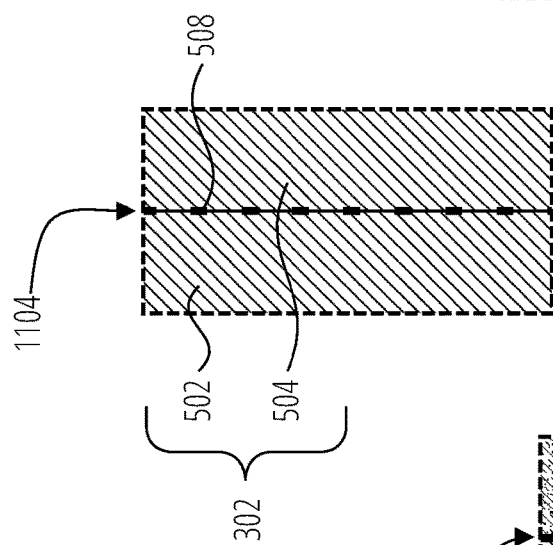
FIG. 11B is an enlarged schematic illustration of dashed box B of either of FIG. 9 or FIG. 10, according to embodiments of the disclosure wherein treatment species are disposed along an interface between portions of conductive material, the treatment species deriving from a surface treatment performed between depositions of the portions of conductive material, as in the fabrication stage of FIG. 5.
Figure 11A:
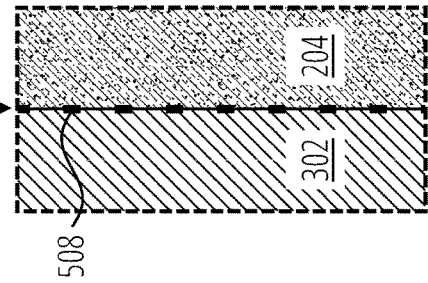
FIG. 11A is an enlarged schematic illustration of dashed box A of either of FIG. 9 or FIG. 10, according to embodiments of the disclosure wherein treatment species are disposed along an interface between a conductive material and an elongate feature patterned in a substrate, the treatment species deriving from a surface treatment performed prior to deposition of conductive material, as in the fabrication stage of FIG. 8.

Microelectronic device structures formed by any one or more of the methods described herein may include the treatment species 508 (and, in some embodiments, the additional treatment species 604) derived from one or more of the surface treatment gas(es) used during the methods. For example, with reference to FIG. 11A, the treatment species 508 may be present along an interface 1102 between the elongate features 204 and the conductive material 302, such as in embodiments including one or more surface treatments before formation of a first portion of the conductive material 302 (e.g., as described above with regard to FIG. 8). With reference to FIG. 11B, the treatment species 508 may be present along an interface 1104 between multiple portions of the conductive material 302 (e.g., between the first portion 502 and the second portion 504 of the conductive material 302), such as in embodiments including one or more surface treatments between two depositions of portions of the conductive material 302 (e.g., as described above with regard to FIG. 5 and FIG. 6). With reference to FIG. 11C, the treatment species 508 may be present along the outer surface 510 of the conductive material 302, such as in embodiments including one or more surface treatments after deposition of the conductive material 302 (e.g., as described above with regard to FIG. 7). With reference to FIG. 11D, treatment species derived from the surface treatment gas(es) may be disposed along multiple interfaces within the conductive material 302, e.g., with the treatment species 508 along the interface 1104 between the first portion 502 and the second portion 504 of the conductive material 302 and with the additional treatment species 604 along another interface 1106 between the second portion 504 and the third (or more) portion 602 of the conductive material 302, such as in embodiments including one or more surface treatment(s) conducted between each of multiple depositions of portions of the conductive material 302 (e.g., as described above with regard to FIG. 6). With reference to FIG. 11E, the treatment species 508 may be dispersed within the volume of the conductive material 302, whether formed in one portion or multiple portions or by one deposition act or multiple deposition acts, such as in embodiments in which the surface treatment gas(es) are introduced concurrently with formation (e.g., deposition) of the conductive material 302.

In some embodiments, the treatment species 508 (and, in some embodiments, the additional treatment species 604) remain at the surface(s) on which they first form from exposure of the surface(s) to the at least one surface treatment gas(es). In other embodiments, however, the treatment species 508 (and, in some embodiments, the additional treatment species 604) migrate (or "float") outward (e.g., nearer to an exterior surface of the conductive material) during subsequent formation of additional conductive material 302 on a treated surface of conductive material 302. Therefore, the treatment species 508 may be disposed on the outer surface 510 (FIG. 7) of the conductive material 302, in a final structure, though the treatment species 508 may have been introduced before forming the conductive material 302 (e.g., as in FIG. 8) or between forming portions of the conductive material 302 (e.g., as in FIG. 5).

Any of the aforementioned conductive material formation (e.g., deposition) acts and/or surface treatment acts may be preceded by or followed by one or more heat treatments (e.g., anneals). For example, an anneal may be performed after treating at least one surface of conductive material, and before forming an additional portion of the conductive material thereon. Such anneal may "set" the at least one surface to, e.g., promote the species (e.g., the treatment species 508) derived from the surface treatment gas(es) to take hold on or in the at least one surface. As another example, an anneal may be performed before exposing a surface to at least one surface treatment gas to ready the surface to accept the species (e.g., the treatment species 508) derived from the surface treatment gas(es).

Any of the foregoing methods may be used in combination with the others. Therefore, the structure 900 of FIG. 9 may include the treatment species 508 along the interface 1102 of FIG. 11A, the treatment species 508 along the interface 1104 of FIG. 11B, the treatment species 508 along the outer surface 510 of FIG. 11C, the additional treatment species 604 along the another interface 1106 of FIG. 11D, and/or the treatment species 508 dispersed within a volume of the conductive material 302 of FIG. 11E (though, such volume illustrated in FIG. 11E may be elsewhere within the conductive material 302 of FIG. 9 than at box D if the embodiment also includes the volume illustrated in FIG. 11D). Likewise with the structure 1000 of FIG. 10.

Accordingly, disclosed is an apparatus comprising elongate features extending vertically from a base structure. Conductive material is on the elongate features. The conductive material has an electrical resistivity of less than about $1\times10^{-6}$ m·Ω. At least one species is in or on the conductive material proximate opposing sidewalls of the conductive material between neighboring elongate features of the elongate features. The at least one species comprises one or more of silicon, titanium, chlorine, carbon, hydrogen, nitrogen, and oxygen.

Nonetheless, the method of forming the structure 900 of FIG. 9 or the structure 1000 of FIG. 10 includes at least one surface treatment in conjunction with (e.g., before, after, and/or during (e.g., concurrent with, alternating with, intermittent to)) formation (e.g., deposition) of one or more conductive material(s) by one or more formation (e.g., deposition) acts. And, the surface treatment(s) diminish or neutralize attractive or cohesive surface forces that may otherwise lead to opposing sidewalls of the conductive material attracting one another and causing line bending and pinch points. By avoiding the line bending and pinch points, subsequent material formation and/or material removal (e.g., etching) acts may be more reliably carried out, including material removal acts to electrically isolate neighboring conductive structures formed from the conductive material. Therefore, microelectronic structures may be reliably formed, using even conductive material(s) that would have—with conventional methods—been prone to causing line bending and pinch points.

Accordingly, disclosed is a method of forming a microelectronic device. The method comprises forming elongate features extending from a base structure and depositing conductive material on opposing sidewalls of the elongate features. At least one surface treatment gas is introduced into a deposition chamber to expose the elongate features, the conductive material, or both to the at least one surface treatment gas. The at least one surface treatment gas comprises at least one species formulated to mitigate one or more of attractive forces and cohesive forces between opposing surfaces of the conductive material. Portions of the conductive material are removed from between the opposing sidewalls of the elongate features after introducing the at least one surface treatment gas.

Figure 12:
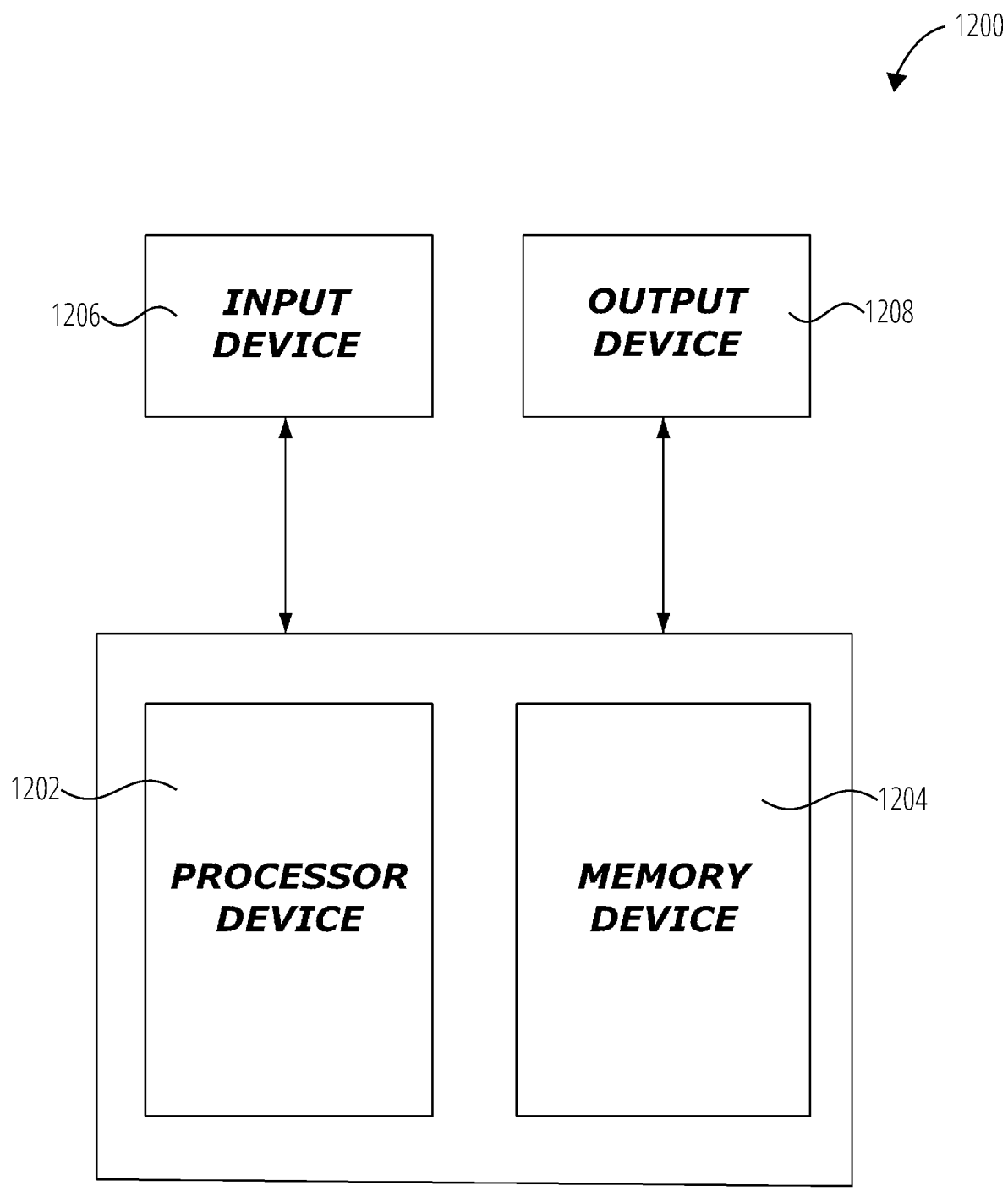
FIG. 12 is a schematic block diagram illustration of an electronic system, in accordance with embodiments of the disclosure.

Microelectronic devices (e.g., semiconductor devices, memory devices (e.g., DRAM devices)) that include structures according to any of FIG. 9 through FIG. 11E, or arrays of any thereof, in accordance with embodiments of the disclosure, may be used in embodiments of electronic systems of the disclosure. For example, FIG. 12 is a block diagram of an illustrative electronic system 1200, according to embodiments of the disclosure. The electronic system 1200 may comprise, e.g., a computer or computer hardware component, a server or other networking hardware component, a cellular telephone, a digital camera, a personal digital assistant (PDA), portable medial (e.g., music) player, etc. The electronic system 1200 includes at least one memory device 1204. The electronic system 1200 may further include at least one electronic signal processor device 1202 (which may otherwise be referred to in the art as a "microprocessor"). At least one of the electronic signal processor device 1202 and the at least one memory device 1204 may include, e.g., an embodiment of the structures of any of FIG. 9 through FIG. 11E or arrays of any thereof. The at least one memory device 1204 and the at least one electronic signal processor device 1202 may be combined on a "system on a chip (SoC)." Therefore, at least one of the electronic signal processor device 1202 and the at least one memory device 1204 may be formed by a method that includes at least one surface treatment performed in conjunction with (e.g., before, during, and/or after) deposition of conductive material on elongate features.

The electronic system 1200 may further include one or more input devices 1206 for inputting information into the electronic system 1200 by a user, e.g., a pointing device (e.g., a mouse), a keyboard, a touchpad, a button, a control panel, or combinations thereof. The electronic system 1200 may further include one or more output devices 1208 for outputting information (e.g., visual output, audio output) to a user, e.g., a monitor, a display, a printer, an audio output jack, a speaker, etc. In some embodiments, the input device 1206 and the output device 1208 may comprise a device configured for both input and output (e.g., a touch screen device) that can be used both to input information into the electronic system 1200 and to output visual information to a user. The one or more input devices 1206 and output devices 1208 may communicate electrically with at least one of the memory device 1204 and the electronic signal processor device 1202.

While the disclosed devices, structures, and methods are susceptible to various modifications and alternative forms in implementation thereof, specific embodiments have been shown by way of example in the drawings and have been described in detail herein. However, the disclosure is not intended to be limited to the particular forms disclosed. Rather, the disclosure encompasses all modifications, combinations, equivalents, variations, and alternatives falling within the scope of the disclosure as defined by the following appended claims and their legal equivalents.

What is claimed is:

1. A method of forming a structure, the method comprising:
    forming a pattern of elongate features extending vertically from a base structure;
    forming conductive material on the elongate features; and
    after completing the forming of the pattern of elongate features, exposing the elongate features, the conductive material, or both to at least one surface treatment gas comprising at least one species formulated to diminish attractive or cohesive forces at a surface of the conductive material.

2. The method of claim 1, wherein exposing the elongate features, the conductive material, or both to the at least one surface treatment gas comprises exposing a portion of the conductive material to the at least one surface treatment gas after forming the portion of the conductive material on the elongate features.

3. The method of claim 2, further comprising, after exposing the portion of the conductive material to the at least one surface treatment gas, forming at least one additional portion of the conductive material on the portion of the conductive material.

4. The method of claim 3, further comprising exposing the at least one additional portion of the conductive material to the at least one surface treatment gas.

5. The method of claim 4, further comprising forming further conductive material on the at least one additional portion of the conductive material to fill a volume between neighboring elongate features of the pattern of elongate features.

6. The method of claim 2, wherein exposing the portion of the conductive material to the at least one surface treatment gas follows completion of forming the conductive material on the elongate features.

7. The method of claim 1, wherein exposing the elongate features, the conductive material, or both to the at least one surface treatment gas comprises exposing the elongate features to the at least one surface treatment gas prior to forming the conductive material on the elongate features.

8. The method of claim 1, wherein exposing the elongate features, the conductive material, or both to the at least one surface treatment gas comprises introducing the at least one surface treatment gas while forming the conductive material on the elongate features.

9. The method of claim 1, further comprising, after forming the conductive material on the elongate features, removing at least one portion of the conductive material to form electrically isolated conductive structures between neighboring elongate features of the pattern of elongate features.

10. The method of claim 1, further comprising selecting the at least one surface treatment gas to comprise one or more of $SiH_4$, $C_8H_{24}N_4Ti$, $TiCl_4$, $BCl_3$, CO, and Hz.

11. The method of claim 1, further comprising selecting the conductive material to comprise one or more of Ru, Mo, W, Ag, and Cu.

12. A method of forming a microelectronic device, the method comprising:
    forming elongate features extending from a base structure;
    depositing conductive material on opposing sidewalls of the elongate features;
    introducing at least one surface treatment gas into a deposition chamber to expose the elongate features, the conductive material, or both to the at least one surface treatment gas, the at least one surface treatment gas comprising at least one species formulated to mitigate one or more of attractive forces and cohesive forces between opposing surfaces of the conductive material; and
    removing portions of the conductive material from between the opposing sidewalls of the elongate features after introducing the at least one surface treatment gas.

13. A microelectronic device, comprising:
    elongate features extending from a base structure; and
    conductive regions between opposing sidewalls of the elongate features, the conductive regions comprising:
        a conductive material; and
        at least one species formulated to mitigate one or more of attractive forces and cohesive forces between opposing portions of the conductive material,
    the conductive regions comprising at least one conductive region electrically isolated from other of the conductive regions.

14. The microelectronic device of claim 13, wherein the conductive material comprises one or more of ruthenium (Ru), molybdenum (Mo), tungsten (W), silver (Ag), copper (Cu), palladium (Pd), platinum (Pt), and rhodium (Rh).

15. The microelectronic device of claim 13, wherein the at least one species comprises silicon (Si), carbon (C), hydrogen (H), nitrogen (N), titanium (Ti), chlorine (Cl), oxygen (O), or combinations of any thereof.

16. The microelectronic device of claim 13, wherein the at least one conductive region comprises the at least one species in an amount within a range from about 0.001 atoms to about 0.01 atoms per volume of the at least one conductive region.

17. The microelectronic device of claim 13, wherein the elongate features comprise a semiconductor material.

18. A structure, comprising:
   a pattern of elongate features extending vertically from a base structure;
   conductive material on the elongate features; and
   at least one species in physical contact with the conductive material, the at least one species formulated to diminish attractive or cohesive forces at a surface of the conductive material.

19. The structure of claim 18, wherein the conductive material substantially covers vertical sidewalls of the elongate features.

20. The structure of claim 18, wherein the conductive material is vertically recessed relative to upper surfaces of the elongate features of the pattern of elongate features.

21. The structure of claim 18, wherein:
   the surface of the conductive material comprises an outer surface; and
   the at least one species is substantially disposed along at least one vertical surface of the conductive material, the at least one vertical surface comprising at least one of:
      the outer surface of the conductive material,
      an interior surface of the conductive material, and
      an interface within the conductive material between multiple interfacing portions of the conductive material.

22. The structure of claim 18, wherein the at least one species is substantially dispersed throughout the conductive material.

* * * * *

UNITED STATES PATENT AND TRADEMARK OFFICE
CERTIFICATE OF CORRECTION

PATENT NO. : 11,935,782 B2
APPLICATION NO. : 17/653790
DATED : March 19, 2024
INVENTOR(S) : Gurtej S. Sandhu et al.

It is certified that error appears in the above-identified patent and that said Letters Patent is hereby corrected as shown below:

In the Claims

Claim 10, Column 20, Line 34, change "CO, and Hz." to --CO, and $H_2$.--

Signed and Sealed this
Twenty-fifth Day of June, 2024

Katherine Kelly Vidal
*Director of the United States Patent and Trademark Office*